(12) United States Patent
Modlin et al.

(10) Patent No.: US 8,296,993 B2
(45) Date of Patent: *Oct. 30, 2012

(54) ULTRASONIC HUMIDIFIER FOR REPELLING INSECTS

(75) Inventors: Kemper O'neal Modlin, Conroe, TX (US); Leo JohnNiekerk, Spring, TX (US)

(73) Assignee: Monster Mosquito Systems, LLC, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/661,358

(22) Filed: Mar. 15, 2010

(65) Prior Publication Data

US 2010/0224697 A1 Sep. 9, 2010

Related U.S. Application Data

(63) Continuation-in-part of application No. 11/985,816, filed on Nov. 16, 2007, now Pat. No. 7,712,249.

(51) Int. Cl.
*A01M 13/00* (2006.01)
*A01M 7/00* (2006.01)

(52) U.S. Cl. ............. 43/132.1; 43/125; 43/129; 261/81; 239/102.2

(58) Field of Classification Search ............. 43/132.1, 43/107, 112, 113, 139, 125, 129; 261/81; 239/102.2, 102.1, 326, 44
See application file for complete search history.

(56) References Cited

U.S. PATENT DOCUMENTS

| | | | | |
|---|---|---|---|---|
| 1,745,838 A | * | 2/1930 | Rosenow | 239/44 |
| 1,807,550 A | * | 5/1931 | Rector | 43/139 |
| 2,083,950 A | * | 6/1937 | Guba | 43/129 |
| 2,576,976 A | * | 12/1951 | Stagner | 43/129 |
| 2,662,332 A | * | 12/1953 | McIntire | 43/129 |
| 2,694,879 A | * | 11/1954 | Stoll | 43/139 |
| 2,851,818 A | * | 9/1958 | Matheny | 43/129 |
| 2,867,360 A | * | 1/1959 | Sharma | 43/125 |
| 3,074,199 A | * | 1/1963 | Johnson et al. | 43/129 |
| 3,200,535 A | * | 8/1965 | Hession, Jr. | 43/129 |
| 3,201,893 A | * | 8/1965 | Jorgen | 43/139 |

(Continued)

FOREIGN PATENT DOCUMENTS

EP 554732 A1 * 8/1993

(Continued)

OTHER PUBLICATIONS

Specification Sheet: Piezoceramic Transducer No. SMUTD25F1000R-S-D4238H12, Steiner & Martins, Inc., Mar. 2004.

(Continued)

*Primary Examiner* — Darren W Ark
(74) *Attorney, Agent, or Firm* — Rudolph J. Buchel, Jr.

(57) ABSTRACT

The present invention is directed to an ultrasonic repellent humidifier for dispersing insect repellant into the air as a micro fine repellent vapor. A repellent tank provides rhodinol and cedarwood oil based repellent to a repellent well. An ultrasonic transducer is positioned in the well beneath the level of the repellent. It vibrates, forming a repellant vapor that is drawn into a vapor duct by a forced air system and out of the unit, dispersing the repellent vapor into the surrounding air. The vibrating portion of the ultrasonic transducer that is exposed to the oil-based repellent is a ceramic material that inhibits residue from forming on the transducer that reduces its efficiency. The ceramic material may be formed on the metal case of the transducer or on the piezoelectric oscillation crystal, or it may be a separately replaceable disc.

17 Claims, 19 Drawing Sheets

U.S. PATENT DOCUMENTS

| | | | |
|---|---|---|---|
| 3,387,607 A * | 6/1968 | Gauthier et al. | 128/200.16 |
| 3,469,785 A * | 9/1969 | Tobin et al. | 239/102.2 |
| 3,490,697 A * | 1/1970 | Best, Jr. | 239/102.2 |
| 3,648,401 A * | 3/1972 | Stains | 43/129 |
| 3,690,317 A * | 9/1972 | Millman | 239/102.1 |
| 3,989,042 A * | 11/1976 | Mitsui et al. | 239/102.2 |
| 4,031,171 A * | 6/1977 | Asao et al. | 239/102.2 |
| 4,037,351 A * | 7/1977 | Springer | 43/112 |
| 4,087,495 A * | 5/1978 | Umehara | 261/81 |
| 4,173,651 A | 11/1979 | Muramoto et al. | |
| 4,238,425 A * | 12/1980 | Matsuoka et al. | 261/81 |
| 4,257,989 A * | 3/1981 | Nishikawa | 261/81 |
| 4,282,673 A * | 8/1981 | Focks et al. | 43/113 |
| RE31,023 E | 9/1982 | Hall, III | |
| 4,519,776 A * | 5/1985 | DeYoreo et al. | 43/132.1 |
| 4,563,313 A * | 1/1986 | Tsuaki | 261/81 |
| 4,603,505 A * | 8/1986 | Millard | 43/112 |
| 4,625,453 A * | 12/1986 | Smith | 43/139 |
| 4,631,152 A * | 12/1986 | Uchida et al. | 261/81 |
| 4,640,804 A * | 2/1987 | Mizoguchi | 261/81 |
| 4,641,053 A * | 2/1987 | Takeda | 239/102.2 |
| 4,644,790 A * | 2/1987 | Mizoguchi | 261/81 |
| 4,663,091 A * | 5/1987 | Seo | 261/81 |
| 4,665,393 A | 5/1987 | Wilder et al. | |
| 4,708,826 A * | 11/1987 | Mizoguchi | 261/81 |
| 4,719,057 A * | 1/1988 | Mizoguchi | 261/81 |
| 4,731,204 A * | 3/1988 | Noma et al. | 261/81 |
| 4,746,466 A * | 5/1988 | Takahashi | 261/81 |
| 4,752,422 A * | 6/1988 | Uchida et al. | 261/81 |
| 4,752,423 A | 6/1988 | Wong | |
| 4,776,990 A * | 10/1988 | Verity | 261/81 |
| 4,785,573 A * | 11/1988 | Millard | 43/112 |
| 4,788,789 A * | 12/1988 | Boobar et al. | 43/113 |
| 4,852,296 A * | 8/1989 | Swanson et al. | 43/112 |
| 4,865,775 A | 9/1989 | Steiner et al. | |
| 4,882,096 A | 11/1989 | Rueben | |
| 4,891,904 A * | 1/1990 | Tabita | 43/125 |
| 4,911,866 A * | 3/1990 | Monroe | 261/81 |
| 4,921,639 A * | 5/1990 | Chiu | 261/81 |
| 4,962,611 A * | 10/1990 | Millard | 43/112 |
| 4,979,330 A * | 12/1990 | Rorant | 43/139 |
| 4,986,937 A * | 1/1991 | Sorio | 261/81 |
| 5,020,270 A * | 6/1991 | Lo | 43/112 |
| 5,034,162 A | 7/1991 | Chiu | |
| 5,037,583 A * | 8/1991 | Hand | 261/26 |
| 5,123,201 A * | 6/1992 | Reiter | 43/107 |
| 5,157,865 A * | 10/1992 | Chang | 43/113 |
| 5,167,090 A * | 12/1992 | Cody | 43/139 |
| 5,176,856 A * | 1/1993 | Takahashi et al. | 261/81 |
| 5,205,064 A * | 4/1993 | Nolen | 43/112 |
| 5,205,065 A * | 4/1993 | Wilson et al. | 43/107 |
| 5,217,165 A * | 6/1993 | Takahashi et al. | 261/81 |
| 5,221,025 A | 6/1993 | Privas | |
| 5,228,233 A * | 7/1993 | Butler et al. | 43/107 |
| 5,231,790 A * | 8/1993 | Dryden et al. | 43/113 |
| 5,241,778 A * | 9/1993 | Price | 43/132.1 |
| 5,241,779 A * | 9/1993 | Lee | 43/139 |
| 5,281,621 A * | 1/1994 | Wilson et al. | 514/459 |
| 5,299,739 A | 4/1994 | Takahashi et al. | |
| 5,300,260 A * | 4/1994 | Keshet et al. | 261/81 |
| 5,301,458 A * | 4/1994 | Deyoreo et al. | 43/139 |
| 5,311,697 A * | 5/1994 | Cavanaugh et al. | 43/132.1 |
| 5,329,725 A * | 7/1994 | Bible | 43/139 |
| 5,336,156 A | 8/1994 | Miller et al. | |
| 5,354,515 A * | 10/1994 | Ushimaru | 261/81 |
| 5,407,604 A * | 4/1995 | Luffman | 261/81 |
| 5,417,009 A * | 5/1995 | Butler et al. | 43/113 |
| 5,576,011 A * | 11/1996 | Butler et al. | 424/411 |
| 5,595,018 A * | 1/1997 | Wilbanks | 43/139 |
| 5,647,164 A * | 7/1997 | Yates | 43/132.1 |
| 5,653,919 A * | 8/1997 | White et al. | 261/81 |
| 5,657,926 A | 8/1997 | Toda | |
| 5,669,176 A * | 9/1997 | Miller | 43/132.1 |
| 5,693,266 A * | 12/1997 | Jung | 261/81 |
| 5,779,804 A * | 7/1998 | Mikoshiba et al. | 261/81 |
| 5,799,436 A * | 9/1998 | Nolen et al. | 43/112 |
| 5,803,362 A | 9/1998 | Fraccaroli | |
| 5,813,166 A * | 9/1998 | Wigton et al. | 43/139 |
| 5,916,490 A * | 6/1999 | Cho | 261/81 |
| 5,943,815 A * | 8/1999 | Paganessi et al. | 43/132.1 |
| 6,032,406 A * | 3/2000 | Howse et al. | 43/107 |
| 6,050,025 A * | 4/2000 | Wilbanks | 43/139 |
| 6,055,766 A * | 5/2000 | Nolen et al. | 43/112 |
| 6,134,826 A * | 10/2000 | Mah | 43/112 |
| 6,199,316 B1 * | 3/2001 | Coventry | 43/132.1 |
| 6,244,576 B1 * | 6/2001 | Tsai | 261/81 |
| 6,272,790 B1 * | 8/2001 | Paganessi et al. | 43/132.1 |
| 6,293,044 B1 * | 9/2001 | Feng | 43/132.1 |
| 6,293,474 B1 * | 9/2001 | Helf et al. | 239/102.2 |
| 6,296,196 B1 * | 10/2001 | Denen et al. | 239/102.2 |
| 6,301,433 B1 * | 10/2001 | Montagnino et al. | 261/79.2 |
| 6,315,272 B1 | 11/2001 | Stanek et al. | |
| 6,339,897 B1 * | 1/2002 | Hayes et al. | 43/132.1 |
| 6,361,024 B1 | 3/2002 | Carson | |
| 6,386,462 B1 * | 5/2002 | Martens, III | 239/102.2 |
| 6,439,474 B2 | 8/2002 | Denen | |
| 6,530,172 B2 * | 3/2003 | Lenz | 43/112 |
| 6,554,203 B2 | 4/2003 | Hess et al. | |
| 6,557,778 B1 | 5/2003 | Shiffler | |
| 6,568,124 B1 * | 5/2003 | Wilbanks | 43/139 |
| 6,591,545 B2 * | 7/2003 | Brunet | 43/112 |
| 6,594,946 B2 * | 7/2003 | Nolen et al. | 43/107 |
| 6,595,208 B1 | 7/2003 | Coffee et al. | |
| 6,601,777 B2 | 8/2003 | Sun et al. | |
| 6,619,562 B2 * | 9/2003 | Hamaguchi et al. | 239/102.1 |
| 6,655,080 B2 * | 12/2003 | Spiro et al. | 43/139 |
| 6,662,489 B2 * | 12/2003 | Spiro et al. | 43/107 |
| 6,663,307 B2 | 12/2003 | Kopanic et al. | |
| 6,675,528 B2 * | 1/2004 | Jablin | 43/132.1 |
| 6,715,739 B2 | 4/2004 | Mulvaney et al. | |
| 6,718,685 B2 * | 4/2004 | Bossler | 43/139 |
| 6,739,518 B1 | 5/2004 | Davis et al. | |
| 6,793,205 B2 * | 9/2004 | Eom | 261/81 |
| 6,802,460 B2 | 10/2004 | Hess et al. | |
| 6,805,307 B2 | 10/2004 | Dorendorf et al. | |
| 6,817,139 B1 * | 11/2004 | Powell et al. | 43/139 |
| 6,823,622 B2 * | 11/2004 | Lin et al. | 43/107 |
| 6,854,208 B1 * | 2/2005 | Chuang et al. | 43/132.1 |
| 6,871,792 B2 | 3/2005 | Pellizzari | |
| 6,877,271 B2 * | 4/2005 | Hughes et al. | 43/132.1 |
| 6,898,896 B1 * | 5/2005 | McBride et al. | 43/139 |
| 6,920,716 B2 * | 7/2005 | Kollars et al. | 43/107 |
| 6,923,383 B1 | 8/2005 | Joshi et al. | |
| 6,962,329 B2 * | 11/2005 | Bachert | 261/81 |
| 6,994,328 B2 * | 2/2006 | Watkins et al. | 261/81 |
| 7,007,861 B2 * | 3/2006 | Ketcha et al. | 239/326 |
| 7,017,829 B2 * | 3/2006 | Martens et al. | 239/326 |
| 7,036,800 B2 | 5/2006 | Ellis | |
| 7,073,287 B2 * | 7/2006 | Lau | 43/112 |
| 7,073,731 B2 | 7/2006 | Hess et al. | |
| 7,073,734 B2 | 7/2006 | Dorendorf et al. | |
| 7,083,112 B2 | 8/2006 | Ivri | |
| 7,104,463 B2 | 9/2006 | Litherland et al. | |
| 7,105,058 B1 | 9/2006 | Sinyagin | |
| 7,131,231 B1 * | 11/2006 | Lee | 43/17 |
| 7,152,809 B2 * | 12/2006 | Ketcha et al. | 43/125 |
| 7,168,630 B1 * | 1/2007 | Ketcha et al. | 43/132.1 |
| 7,181,885 B2 * | 2/2007 | Spiro et al. | 43/139 |
| 7,223,361 B2 * | 5/2007 | Kvietok et al. | 239/326 |
| 7,234,268 B2 * | 6/2007 | Welch | 43/112 |
| 7,320,439 B2 * | 1/2008 | Davis et al. | 43/132.1 |
| 7,363,745 B2 * | 4/2008 | Hsin-Chang et al. | 43/139 |
| 7,467,786 B2 * | 12/2008 | Jae-Bong et al. | 261/81 |
| 7,712,249 B1 | 5/2010 | Modlin et al. | 43/132.1 |
| 7,946,748 B2 * | 5/2011 | Shen | 43/129 |
| 2002/0159916 A1 * | 10/2002 | Whitby et al. | 43/129 |
| 2004/0128904 A1 * | 7/2004 | Chen | 43/139 |
| 2005/0274061 A1 * | 12/2005 | Zhu | 43/132.1 |
| 2005/0279854 A1 * | 12/2005 | Martens et al. | 239/44 |
| 2006/0010763 A1 * | 1/2006 | Podlewski et al. | 43/17.6 |
| 2006/0011739 A1 * | 1/2006 | Jaworski | 239/102.2 |
| 2006/0065755 A1 * | 3/2006 | Sugita et al. | 239/1 |
| 2006/0091570 A1 * | 5/2006 | Reece | 43/125 |
| 2006/0137241 A1 * | 6/2006 | Yamasaki et al. | 43/132.1 |
| 2006/0156618 A1 * | 7/2006 | Kulkarni et al. | 43/139 |
| 2006/0179708 A1 * | 8/2006 | Garland | 43/132.1 |
| 2006/0218851 A1 * | 10/2006 | Weiss et al. | 43/139 |

| | | | | |
|---|---|---|---|---|
| 2006/0260183 A1* | 11/2006 | Hockaday | | 43/132.1 |
| 2006/0261188 A1* | 11/2006 | Ito et al. | | 43/132.1 |
| 2007/0011940 A1* | 1/2007 | Chen et al. | | 43/139 |
| 2007/0068068 A1* | 3/2007 | Weiss et al. | | 43/132.1 |
| 2007/0152356 A1* | 7/2007 | Huang | | 261/81 |
| 2007/0157508 A1* | 7/2007 | Chang | | 43/139 |
| 2007/0224232 A1* | 9/2007 | Sherwood | | 424/405 |
| 2007/0235555 A1* | 10/2007 | Helf et al. | | 239/102.2 |
| 2007/0237498 A1* | 10/2007 | Helf et al. | | 239/44 |
| 2007/0256351 A1* | 11/2007 | Milton | | 43/132.1 |
| 2008/0011874 A1* | 1/2008 | Munagavalasa et al. | | 239/102.2 |
| 2008/0067263 A1 | 3/2008 | Modlin et al. | | |
| 2008/0073443 A1* | 3/2008 | Tollens et al. | | 239/102.2 |
| 2008/0088202 A1* | 4/2008 | Duru | | 239/102.2 |
| 2008/0099572 A1* | 5/2008 | Tollens et al. | | 239/102.2 |
| 2008/0178518 A1* | 7/2008 | Reece | | 43/125 |
| 2008/0290189 A1* | 11/2008 | Levi | | 239/102.2 |

FOREIGN PATENT DOCUMENTS

| | | | |
|---|---|---|---|
| EP | 1138199 A2 * | 10/2001 | |
| EP | 1716753 A1 * | 11/2006 | |
| EP | 1745697 A1 * | 1/2007 | |
| JP | 52000660 | 1/1975 | |
| JP | 61107009 A * | 5/1986 | |
| JP | 03162862 A * | 7/1991 | |
| JP | 04298262 | 10/1992 | |
| JP | 05000040 | 1/1993 | |
| JP | 05161443 A * | 6/1993 | |
| JP | 08215308 A * | 8/1996 | |
| JP | 10033103 A * | 2/1998 | |
| JP | 11056196 A * | 3/1999 | |
| JP | 11221505 A * | 8/1999 | |
| JP | 11285341 A * | 10/1999 | |
| JP | 2000060403 A * | 2/2000 | |
| JP | 2001231424 A * | 8/2001 | |
| JP | 2002086035 A * | 3/2002 | |
| JP | 2004147643 A * | 5/2004 | |
| JP | 2004236508 A * | 8/2004 | |
| JP | 2006051016 A * | 2/2006 | |
| JP | 2006116448 A * | 5/2006 | |
| WO | WO 9805432 A1 * | 2/1998 | |
| WO | WO 03007709 A1 * | 1/2003 | |
| WO | WO 2006061651 A2 * | 6/2006 | |
| WO | WO 2006121346 A1 * | 11/2006 | |

OTHER PUBLICATIONS

Specification Sheet: Piezoceramic Transducer No. SMUTD15F2800R-RA, Steiner & Martins, Inc., Feb. 2004.

C2003 Instruction Manual, Humidifier Data Sheet, Beijing YADU Indoor Environmental Protection Science & Technology Incorporated, PC CHina.

Specification Sheet: Piezoceramic Transducer No. TPC-H2518-1. 65MR, Taiwan Piezo-Ceram Technology Corp:, 2001.

Owners Manual, Crofton; Ultrasonic Humidifier Model Model HM-858, Schenker International Inc., Referenced prior to Jan. 17, 2006.

Ultrasonic Nebulizer Units, TDK Corporation, Doc. No. 001-01 / 20071011 / ef441_nb., Accessed http://www.tdk.co.jp/tefe02/ef441_nb.pdf Incorporate Type.

Ultrasonic Humidifiers, Department of Energy, Document No. DOE/EE-0180, Nov. 1988.

Buying Guide, Ultrasonic Mist Generator-The Transducer, Mico Inc., http://www.oceanmistmaker.com/foggers.html, last accessed Nov. 16, 2007.

Honge USB Mini Humidifier HG801, Instruction Manual, Humidifier Data Sheet, Honge Electrical Appliance Company, http://www.cnhonge.cn/english/showproduct.asp?id=30 342# JinQiao Road CiXi, Ning Bo China.

* cited by examiner

FIG. 2
EXPLODED CROSS-SECTIONAL VIEW AT A-A
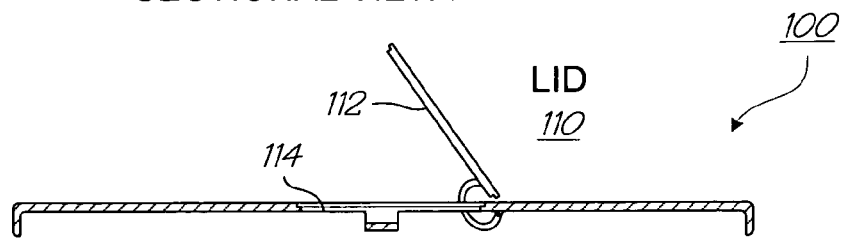
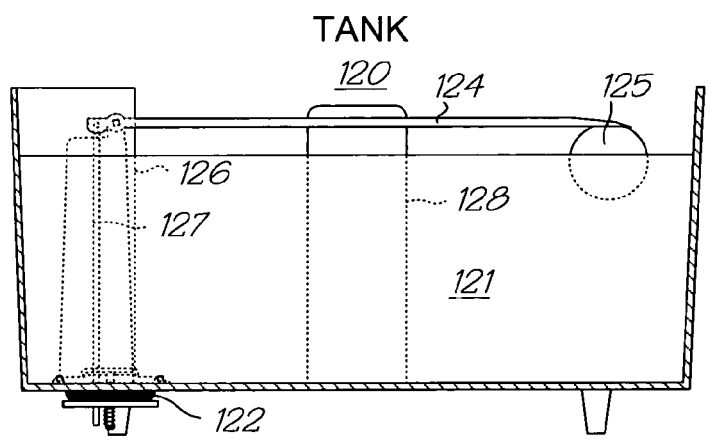
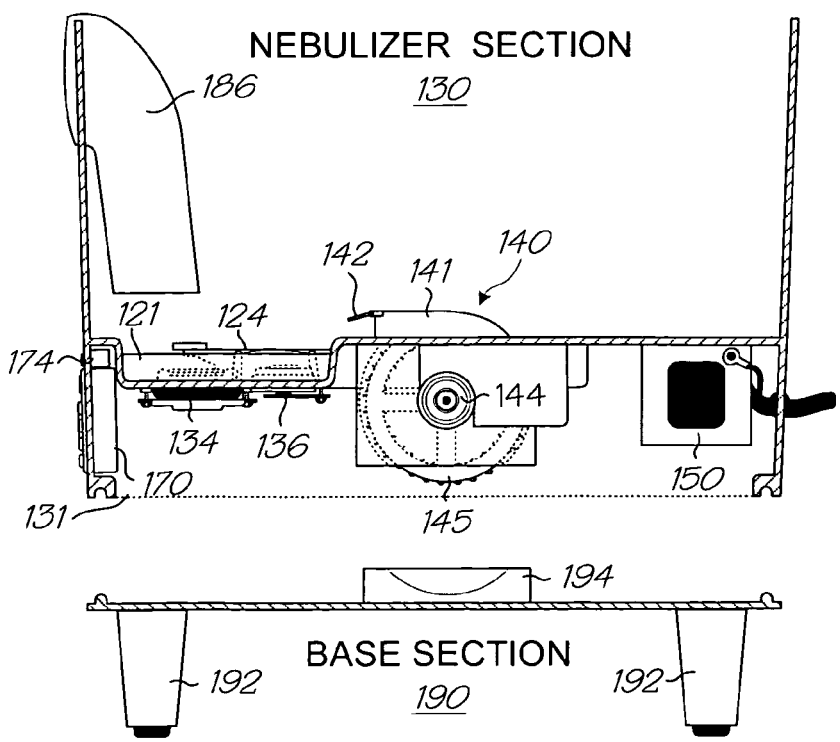

NEBULIZER SECTION
130

TOP VIEW

FRONT VIEW

NEBULIZER SECTION
130

BOTTOM VIEW

CROSS-SECTIONAL
VIEW AT B-B

TANK SECTION 120

TOP VIEW

FRONT VIEW

A–A CROSS-SECTIONAL VIEW

BASE SECTION
190

BOTTOM VIEW

FRONT VIEW

CROSS-SECTIONAL
VIEW AT B-B

CROSS-SECTIONAL VIEW AT A-A

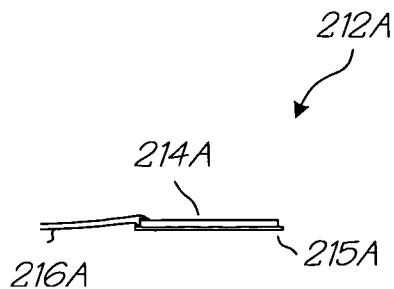
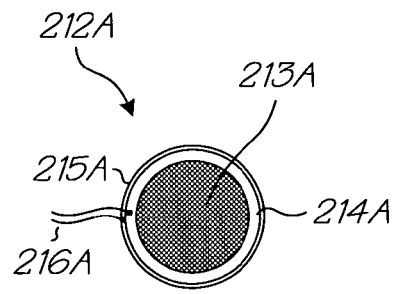
FIG. 12A  FIG. 12B
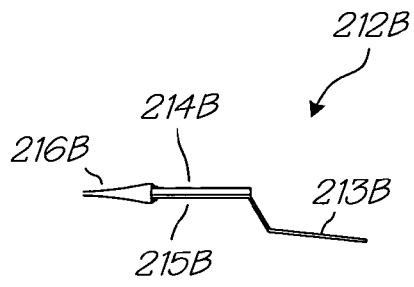
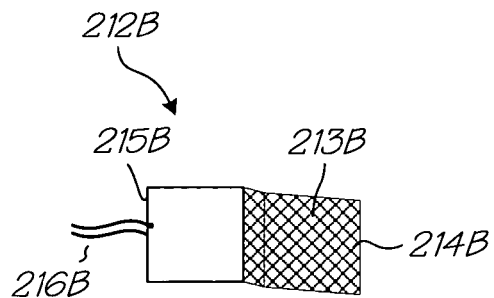
FIG. 12C  FIG. 12D
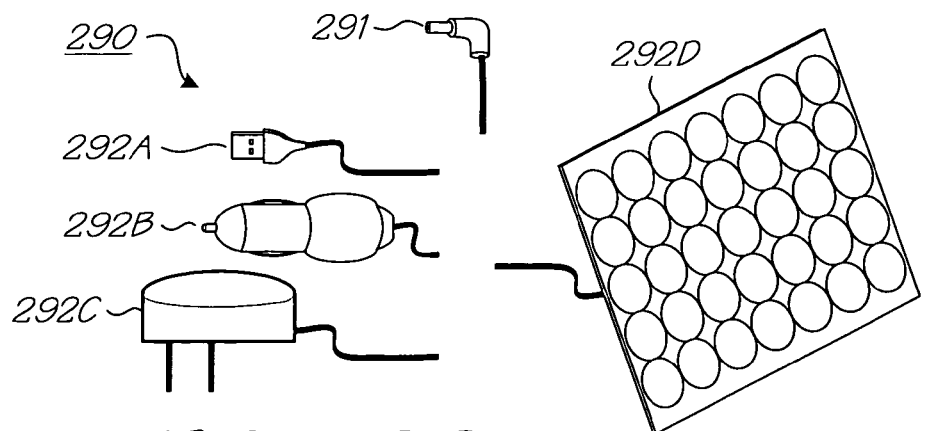
FIG. 10C

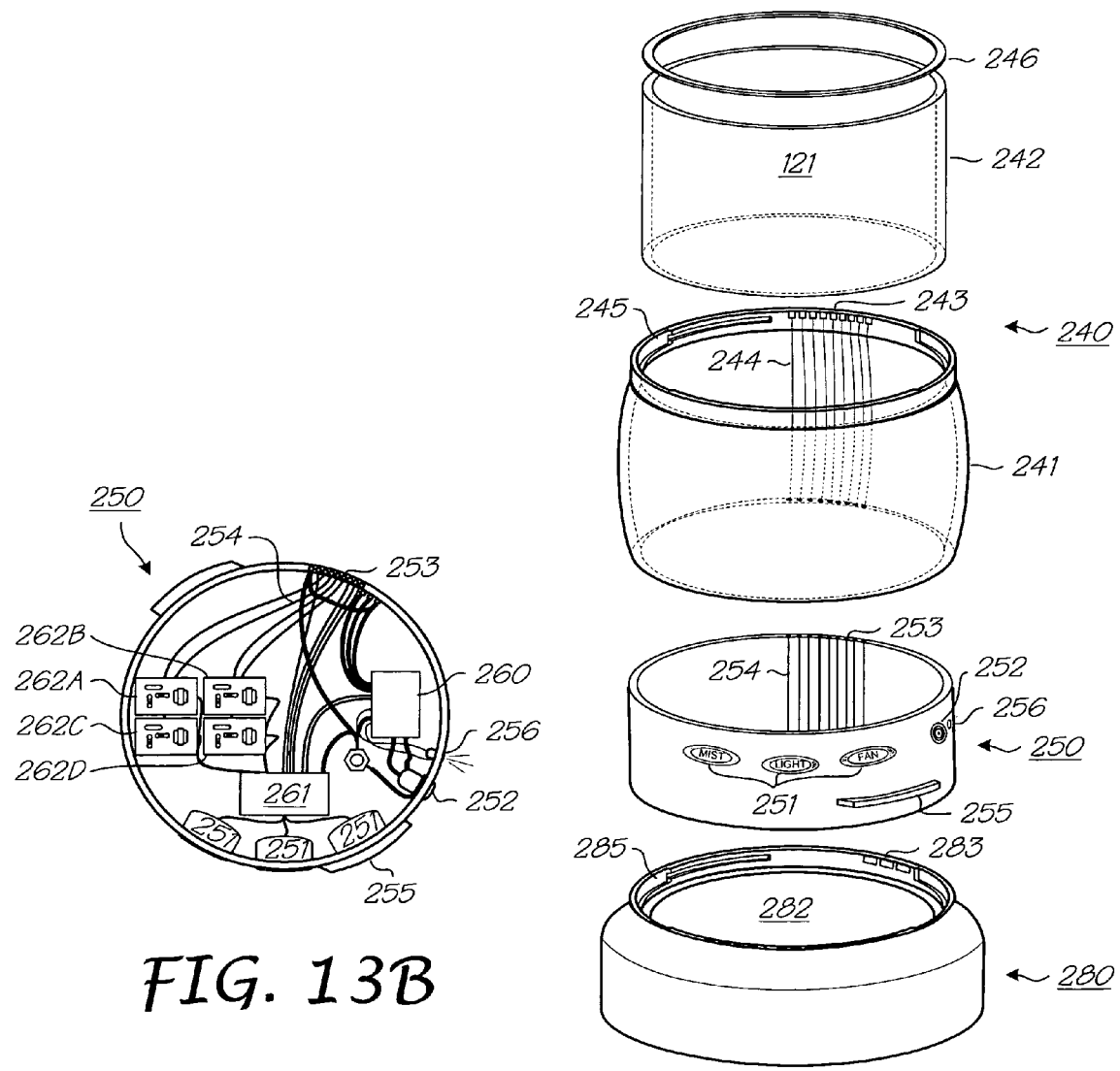

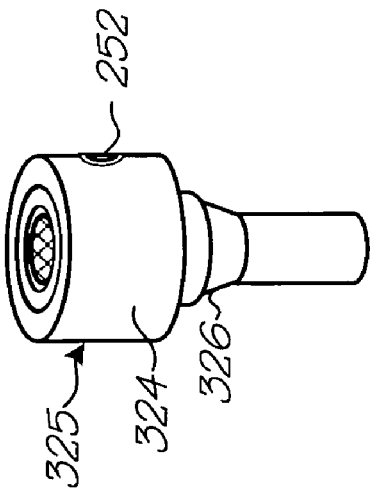
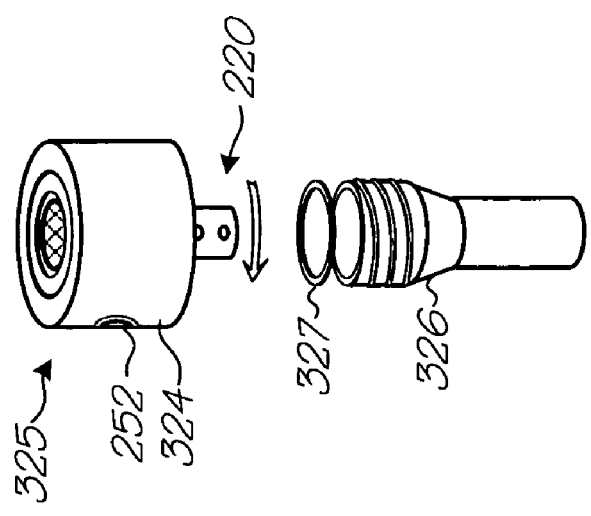
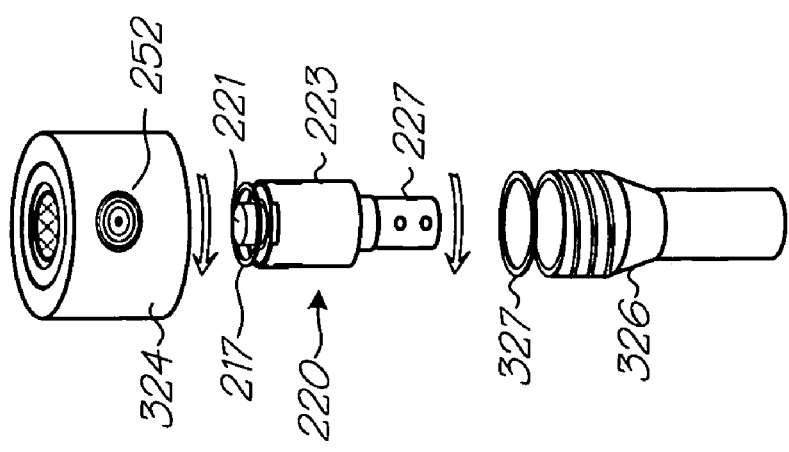

ULTRASONIC HUMIDIFIER FOR REPELLING INSECTS

CROSS-REFERENCE TO RELATED APPLICATIONS

This application is a continuation in part, related to and claims the benefit of priority to currently U.S. patent application Ser. No. 11/985,816 filed Nov. 16, 2007 now U.S. Pat. No. 7,712,249, entitled "Ultrasonic Humidifier for Repelling Insects," which is assigned to the assignee of the present invention. This application is also related to U.S. patent application Ser. No. 11/524,073 filed Sep. 20, 2006, entitled "Automated Pest Misting System With Pump," which is assigned to the assignee of the present invention. The above identified application is incorporated by reference herein in its entirety.

BACKGROUND OF THE INVENTION

The present invention relates generally to a device for repelling insects. More particularly, the present invention relates to an ultrasonic humidifier for dispersing insect repellant into the air.

Many types of insects and other nuisance bugs are considered pests, because they transmit diseases, damage structures or destroy agricultural products. Parasitic insects, such as mosquitoes, biting flies (black and greenhead), no-see-ums, lice, chiggers, ticks and bedbugs are notorious for decreasing the enjoyment of the out-of-doors for humans and pets alike. The options for pest control are generally limited to killing/capturing or repelling techniques.

Nuisance pests are typically killed through the application of a pesticide, such as by misting an area (see for example U.S. patent Ser. No. 11/524,073 to Modlin, et al. filed Sep. 20, 2006 and entitled "Automated Pest Misting System with Pump," assigned to the assignee of the present invention, which is incorporated herein in its entirety), or through the use of bait and trap systems such as fly strips, $CO_2$/octenol traps or electric bug zappers that attempt to attract pests with scent, heat, chemicals or light, or a combination of the above, and then either trap or kill pests that are lured to the bait. Each of these techniques has the unwanted detriment of killing beneficial insects, such as bees, butterflies, ladybugs and dragonflies, along with the nuisance insects. While there have been some advancements in biocontrol and in luring only nuisance insects to a trap, e.g., luring adult Japanese beetles into traps using beetle pheromones, generally it is difficult to attract unrelated types of nuisance insects to the exclusion of beneficial insects. The term insect will be used hereinafter as synonymous with bugs and/or pests, whether the pests fit the traditional definition of an insect and regardless of whether the pests move around by walking, crawling, hopping, jumping or flying.

To date, one of the most effective method for repelling insects is by applying a coating of insect repellant containing synthesized DEET (n-n-diethylnetatoluamide) over exposed body parts and clothing which mosquitoes might penetrate. Currently DEET is the active ingredient in a wide range of repellants, such as creams, lotions, and aerosols. The disadvantages of using an insect repellant are many. For instance, the oily feel, they cause irritation to eyes, lips and other sensitive areas and can cause a skin reaction with some users, sometimes serious, and DEET is less effective in low concentrations, while higher concentrations may result in an increased risk of reaction. The product will often damage and/or stain certain plastics and fabrics and detractors often complain about the strong 'chemical' smell prevalent with DEET usage. Most people avoid using insect repellents around their home unless they intend to be outside for a prolonged period of time. Moreover, insect repellants are inconvenient and bothersome; they detract from the enjoyment with other people, such as on trips to the beach or camping, tailgating or picnicking.

Another, more convenient and environmentally friendly method for controlling nuisance pests in an area, is by application of a repellant throughout a control area. Although electronic repellants exist, such as by generating sound energy electronically at frequencies that repel insects, by far the most effective means is through the application of chemical repellants. Everyone has probably burned citronella to repel mosquitoes or heard of burning citronella in candles or torches or the like. Citronella candles and lamp fuel is relatively inexpensive, nontoxic and fairly easy to use. The active insect repelling ingredient in citronella, PMD (p-menthane 3,8-diol) has been demonstrated to repel mosquitoes, however, the recommended concentration of PMD is approximately ten percent and then citronella usually only repels mosquitoes for ten to twenty minutes. The reason that burning citronella is not always effective is that oftentimes the airborne concentration of PMD is very low, either because of the concentration being burned, or more probably because the dispersion pattern of the citronella fumes is not homogeneous in the control area. Insects do not breathe the way that mammals do and they do not have lungs, but instead they use tracheal respiration to transport air from spiracle openings on the surface of their bodies. Spiracles are located all along the insects' abdomens. It follows that the more effectively a repellent is dispersed in a control area, the more spiracles on an insect's body will receive the repellent. Burning citronella has been reported to form long airborne 'spider webs' when burned rather than a homogeneous concentration within the control area. Light breezes that do not affect mosquitoes sometimes move the citronella fumes completely out of the control area. Furthermore, it is difficult to meter the amount of citronella in the air, at best the user lights more or less candles or torches and repositions them in the control area for effectiveness.

Handheld trigger sprayers for broadcasting repellents are well known and widely used, especially around farm animals and in kennels and stables. Certain mosquito repellents are also sprayed from trigger or larger pump sprayers. However, these repellants are generally not meant to remain airborne, but are often applied to ground cover, yards, gardens and campgrounds. Typically, these repellents have an aromatic ingredient, such as concentrated garlic solution, that has some repelling properties, but actually kills most insects that come in contact with it. Automated misting systems, such as those disclosed in the Modlin application identified above, may be altered for dispersing repellents rather than insecticides. It should be mentioned that the Modlin device utilizes misting transducer assembly heads rather than transducer assembly heads. Spraying systems are less effective for repelling flying pests because the particle size ejected from a spray head is relatively large, usually greater than 50 microns, and therefore they do not remain suspended in the air for longer than a very few seconds. A mist has fewer open spaces or gaps between particles than a spray, and is generally less dense and will remain airborne longer than spray particles. Mist infers that the diameter of the suspended liquid is generally between 30 microns and 50 microns.

While misting systems are much more effective for dispensing repellents, the repellent mist will eventually fall out of the air and lose its effectiveness. What is needed is a safe and effective repellant dispersion system for use out-of-doors.

BRIEF SUMMARY OF THE INVENTION

The present invention is directed to an ultrasonic repellent humidifier for dispersing insect repellant into the air as a micro fine repellent vapor. A repellent tank provides rhodinol and cedarwood oil based repellent to a repellent well. An ultrasonic transducer is positioned in the well beneath the level of the repellent. It vibrates, forming a repellant vapor that is drawn into a vapor duct by a forced air system and out of the unit, dispersing the repellent vapor into the surrounding air. The vibrating portion of the ultrasonic transducer that is exposed to the oil-based repellent is a ceramic material that inhibits residue from forming on the transducer that reduces its efficiency. The ceramic material may be formed on the metal case of the transducer or on the piezoelectric oscillation crystal, or it may be a separately replaceable disc.

BRIEF DESCRIPTION OF THE SEVERAL VIEWS OF THE DRAWINGS

The novel features believed characteristic of the present invention are set forth in the appended claims. The invention itself, however, as well as a preferred mode of use, further objectives and advantages thereof, will be best understood by reference to the following detailed description of an illustrative embodiment when read in conjunction with the accompanying drawings wherein:

FIG. 2 is a diagram depicting an exploded cross-sectional view of the sections of a repellent humidifier for exterior use in accordance with an exemplary embodiment of the present invention;

FIGS. 10A, 10B and 10C are diagrams of a portable ultrasonic repellent humidifier in accordance with exemplary embodiments of the present invention;

FIGS. 12A and 12B illustrate an ultrasonic transducer having a round vibrating surface, while FIGS. 12C and 12D illustrate another ultrasonic transducer design having a linear-shaped round vibrating surface in accordance with an exemplary embodiment of the present invention;

FIGS. 13A and 13B depict the relationship between base/battery assembly 280, control assembly 250 and tank assembly 240 are graphically represented in accordance with other exemplary embodiments of the present invention;

FIGS. 15A, 15B and 15C depict remotely positionable transducer assembly 325 that is adaptable to conventional threaded pipe sub 326, such as a hose nibble or the like, in accordance with an exemplary embodiment of the present invention;

Figure 1A:
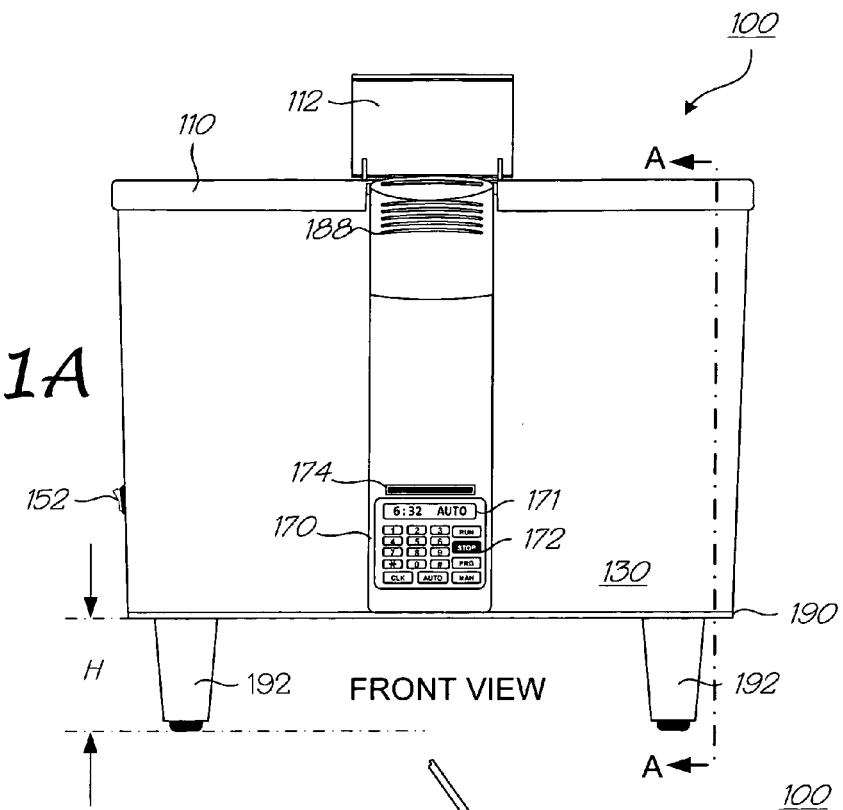
FIGS. 1A and 1B show the front and side views of a repellent humidifier for exterior use in accordance with an exemplary embodiment of the present invention.

Other features of the present invention will be apparent from the accompanying drawings and from the following detailed description.

DETAILED DESCRIPTION OF THE INVENTION

| Element Reference Number Designations | |
|---|---|
| 100: | Ultrasonic Humidifier |
| 110: | Lid Section |
| 112: | Tank Fill Cover |
| 114: | Tank Fill Opening |
| 120: | Tank Section |
| 121: | Repellant |
| 122: | Tank Valve |
| 123: | Repellant Vapor |
| 124: | Tank Float Assembly |
| 125: | Tank Float |
| 126: | Float Assembly Pedestal |
| 127: | Switch Actuating Rod |
| 128: | Tank Handle |
| 130: | Humidifier Section |
| 131: | Nebulizer Volume |
| 132: | Repellant Well |
| 133: | Sump |
| 134: | Ultrasonic Transducer Assembly |
| 135: | Ultrasonic Transducer Assembly |

-continued

Element Reference Number Designations

| | |
|---|---|
| 136: | Well Level Switch |
| 137: | Well Level Sensor |
| 138: | Tank Level Switch |
| 139: | Tank Level Switch Cover |
| 140: | Fan |
| 141: | Fan Shroud |
| 142: | Shroud Louver |
| 143: | Fan Motor Support |
| 144: | Fan Motor |
| 145: | Fan Impeller |
| 146: | Optional Battery |
| 147: | Optional Battery Charger/Rectifier |
| 148: | Optional Low Voltage Input |
| 150: | Transformer |
| 151: | AC Input |
| 152: | GFI Power Switch |
| 163: | Well Float Contact |
| 164: | Well Float Assembly |
| 165: | Well Float |
| 166: | Well Assembly Pedestal |
| 170: | Control Panel |
| 171: | Display |
| 172: | Panel Input Buttons/Switches |
| 174: | Motion Sensor |
| 175: | Transducer Case |
| 176: | Transducer Seal |
| 177: | Metal Disk |
| 178: | Transducer (Piezoelectric Crystal) |
| 179: | Ceramic Cover |
| 180: | Seal/O-ring |
| 184: | Optional Diverter |
| 186: | Vapor Duct |
| 188: | Vapor Vents/Register |
| 190: | Bottom Section |
| 192: | Legs |
| 194: | Air Vent |
| 196: | Fan Shroud |
| 200: | Portable Ultrasonic Humidifier |
| 201: | Freestanding Ultrasonic Humidifier |
| 202: | Handle |
| 202: | Extension |
| 210: | Nebulizer Assembly |
| 212A: | Concentric Transducer Assembly |
| 213A: | Circular Permeable Vibrating Surface Portion |
| 214A: | Transducer (Piezoelectric Crystal) |
| 215A: | Vibrating Surface |
| 216A: | Power Leads |
| 212B: | Cantilever Transducer Assembly |
| 213B: | Cantilever Permeable Vibrating Surface Portion |
| 214B: | Transducer (Piezoelectric Crystal) |
| 215B: | Vibrating Surface |
| 216B: | Power Leads |
| 217: | Transducer Seal (Upper and Lower) |
| 218: | Transducer Assembly Retainer |
| 219: | Transducer Well/Seat |
| 220: | Repellant Well and Wick Assembly |
| 221: | Wick |
| 222: | Wick Screen/Filter |
| 223: | Wick Support Housing |
| 224: | Support Housing Lock Ring |
| 225: | Wick Support Housing Spring |
| 226: | Spring Compression Housing |
| 227: | Lock Ring Catch |
| 228: | Support Housing Coupler (Male) |
| 230: | Transducer Mounting Surface |
| 231: | Mounting (LED) Housing |
| 232: | Upper Surface (Fan Mounting Surface) |
| 233: | Transducer Opening |
| 234: | Fan |
| 235: | Louvers |
| 236: | Fan Inlet |
| 237: | Mounting Housing Coupler (Male) |
| 238: | LED Bulbs |
| 240: | Tank Assembly |
| 241: | Outer Housing |
| 242: | Repellant Tank |
| 243: | Electrical Contacts |
| 244: | Conductors |

-continued

Element Reference Number Designations

| | |
|---|---|
| 245: | Tank Assembly Coupler (Female) |
| 246: | Tank Seal |
| 250: | Control Assembly |
| 251: | Control Switch |
| 252: | Power Receptacle |
| 253: | Electrical Contacts |
| 254: | Conductors |
| 255: | Control Assembly Coupler (Male) |
| 256: | Power Status Indicator Light |
| 260: | Power Controller/Recharger |
| 261: | Transducer/Fan/Light Controller |
| 262A: | Transducer Driver Circuit |
| 262B: | Transducer Driver Circuit |
| 262C: | Transducer Driver Circuit |
| 262D: | Transducer Driver Circuit |
| 280: | Base/Battery Assembly |
| 282: | Battery |
| 283: | Electrical Contacts |
| 285: | Base Assembly Coupler (Female) |
| 290: | Power Adapter Assembly |
| 291: | Power Jack |
| 292A: | USB Power Adapter |
| 292B: | 12 VDC Car Power Adapter |
| 292C: | 110 VAC Power Adapter |
| 292D: | 12 VDC Regulated Solar Panel |
| 300: | Automated Ultrasonic Humidifier System |
| 302: | Repellant Tank |
| 303: | Inlet Tube |
| 304: | Suction Tube |
| 306: | Filter |
| 320: | Dispersing Elements |
| 322: | Tubing |
| 323: | Transducer Power Conductor |
| 324: | Transducer Assembly Head |
| 325: | Remotely Positionable Transducer Assembly |
| 326: | Threaded Sub |
| 327: | Seal |
| 330: | Controller Unit |
| 332: | Pump Control Switch |
| 334: | Low-Pressure Pump |
| 335: | Keypad |
| 336: | Programmable Controller |
| 337: | Display |
| 338: | Battery |
| 339: | Rotary Switch |
| 340: | Battery Charger |
| 341: | Charger A/C Port |
| 342: | Bus |
| 343: | External Connector |
| 344: | Reservoir Bus Connector |
| 345: | Reservoir Bus |
| 346: | Transducer Power Bus |
| 347: | External Power Conductor Coupler |
| 350: | Controller Unit |
| 351: | Mounting Hole |
| 352: | Enclosure |
| 353: | Mounting Fastener |
| 354: | Door |
| 356: | Hinges |
| 358: | Door Lock |
| 359: | Locking Latch |
| 360: | Exposed External Control Panel |
| 362: | Vapor Button |
| 364: | Indicator Lights |
| 365: | Auxiliary Coupler |
| 366: | OFF Button |
| 372: | Solar Recharge Cell |
| 374: | Weather Sensor |
| 375: | Motion Sensor |
| 376: | Optional Vaporization Light |
| 378: | Optional Audible Alert |
| 401: | Suction Assembly |
| 402: | Agitator Suction Assembly |
| 403: | Supply Tube |
| 404: | Suction Tube |
| 406: | Filter |
| 408: | Agitator Body |
| 444: | Reservoir Bus Connector |

-continued

| | Element Reference Number Designations |
|---|---|
| 445: | Reservoir Bus |
| 446: | Reservoir Cap |
| 447: | Fluid Level Sensor Wire |
| 448: | Low Fluid Sensors |
| 449: | Reservoir Cap |
| 450: | Agitator Motor |
| 451: | Empty Sensors |
| 452: | Agitator Impeller Shaft |
| 454: | Agitator Impeller |
| 456: | Agitator Intake Slots |
| 458: | Agitator Outlet |
| 500: | Automated Misting System |
| 502: | Internal Repellant Tank |
| 503: | Refill Cap/Tube |
| 504: | Suction Tube |
| 506: | Pesticide Level |
| 508: | Diluted Strata |
| 510: | Pressurized Water Source |
| 511: | Injector To Pump Tubing |
| 512: | Safety Valve |
| 514: | Check Valve |
| 534: | Pressure Regulator Valve |
| 535: | Buttons |
| 536: | Programmable Controller |
| 537: | Display |
| 538: | Battery |
| 540: | Battery Charger/Rectifier |
| 541: | AC Power Port |
| 542: | Injector |
| 550: | Controller Unit |
| 552: | Cabinet Enclosure |
| 554: | Door |
| 556: | Drain Valve |

Humidifiers are a well known devices for saturating air with water vapor and are of generally two types: evaporative and mechanical. Evaporative humidifiers evaporate water molecules in the air either by raising the temperature of the water (by using a heat coil) or by increasing the surface area of the water and decreasing its surface tension (by using a wick or filter). Vapor type evaporative humidifiers have many disadvantages such as high energy use, residue and scale accumulation and they are often incompatible with ingredients in the water that result from the thermal energy breaking down or altering certain chemical components. Wick-type humidifiers are relatively inefficient in the moderate to high relative humidity range and the wick demands constant cleaning. Mechanical type humidifiers utilize either a spinning impeller or an ultrasonic element to disperse small droplets of water in the air without heating. In the first type, a rotating drum is partially immersed in a water bath and as it spins, it picks up water and flings it at a diffuser, which breaks the water into fine particles that float in the air.

Ultrasonic humidifiers and nebulizers are well known devices for exciting a liquid to such a level that the liquid evaporates without the addition of any thermal energy. Certain medications have a synergistic effect when vaporized, such as vaporizing water with eucalyptus oil for use as a decongestant. One of the selling points of ultrasonic nebulizers is that the vapor they produce has more consistent, uniform and smaller particle size compared to other types of nebulizer technology. Particle size with the impeller type nebulizers can be more varied and larger, simply because of the interaction between the water droplets traveling at different speeds from the drum to the diffuser, whereas ultrasonic vibrations are constant, reliable and steady. It has long been understood that the more uniform, smaller particle sizes makes the medicated mist penetrate more deeply into the lungs. Ultrasonic humidifiers generally operate by imparting mechanical energy to a liquid thereby exciting the liquid molecules without increasing the intrinsic heat of the liquid. Thus, a liquid may be subjected to a rapidly vibrating (or oscillating) component in order to absorb enough mechanical energy to change its physical state through a process known as inertial cavitation. Although the cavitation process appears rather mundane, it is a violent process that sets up mechanical energy fields, such as acoustical, that can damage surrounding mechanisms and is a major source of wear for propellers and impellers. Cavitation occurs at an ultrasonic transducer which vibrates rapidly, first oscillating in the negative direction which creates an ultra-low pressure void in the water adjacent to the transducer that pulls in water vapor and then in the positive direction that forces the water vapors into bubbles and away from the transducer; the result is often referred to as 'pulverized water.' This vibrating energy also has a detrimental effect of breaking down certain unstable components into potentially harmful subspecies and ions which may damage certain components of the device, in much the same manner as heating the liquid might. Therefore, humidifiers are not suitable for vaporizing every type of liquid. Furthermore, the entire device is subjected to emersion in the vaporized liquid, so every part of the device is exposed to potentially detrimental effects of the vaporized liquid compounds. Consequently, humidification and nebulizing devices are typically employed in highly structured environments and under supervised conditions.

Ultrasonic type humidifiers are well known in the prior art as exemplified by U.S. Pat. Nos. 4,752,422, 4,752,423 and 4,921,639, which are incorporated herein by reference in their entireties. These describe, generally, a unit with a water well in which a high frequency ultrasonic transducer is immersed. The transducer typically comprises a piezoelectric crystal which vibrates rapidly, producing a fine water vapor which is dispersed into the atmosphere by an air current from a blower fan.

Mechanical humidifiers do not selectively atomize only water but they disperse water and whatever contaminants are contained in the water at approximately proportional concentrations. Therefore, mechanical humidifiers will disperse repellants effectively without some of the disadvantages associated with heating the liquid repellent. However, because ultrasonic humidifiers do not thermally vaporize only the water molecules, or disinfect it, they also disperse any suspended material in the water to the air such as microorganisms and minerals.

Figure 1B:
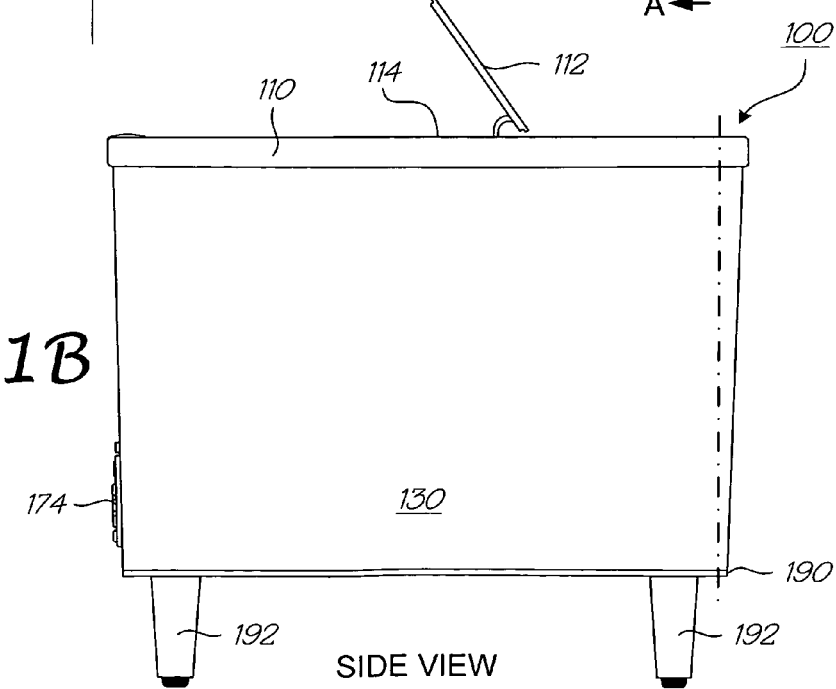
Figure 3A:
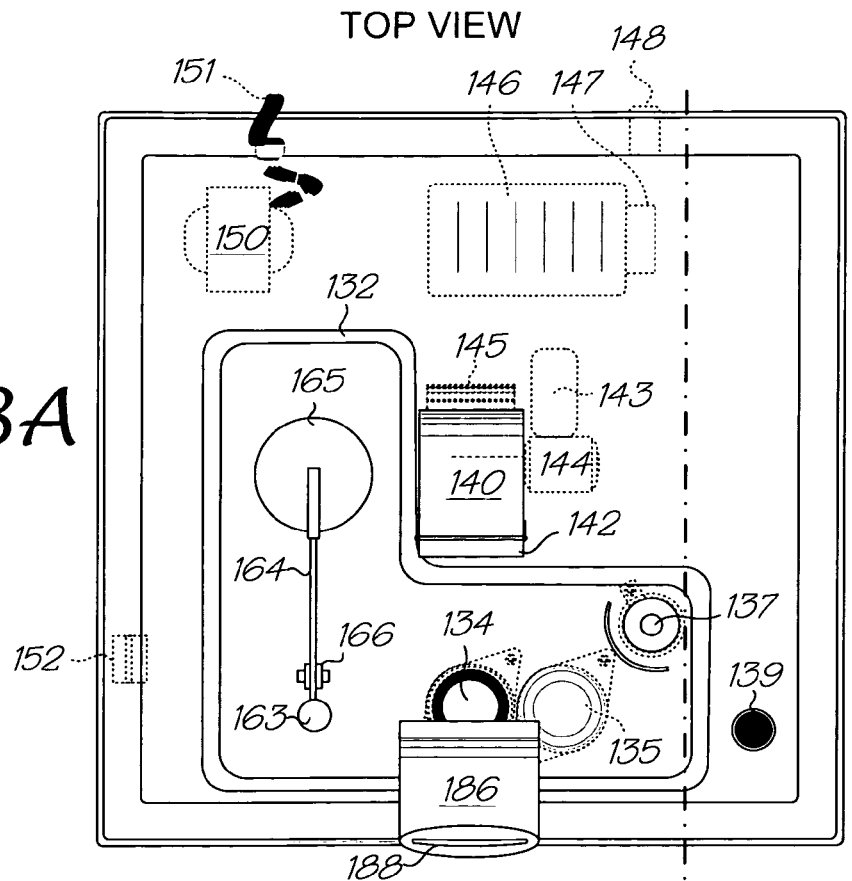
FIGS. 3A, 3B, 3C and 3D are diagrams depicting various views of the nebulizer section of a repellent humidifier for exterior use in accordance with an exemplary embodiment of the present invention.
Figure 3B:
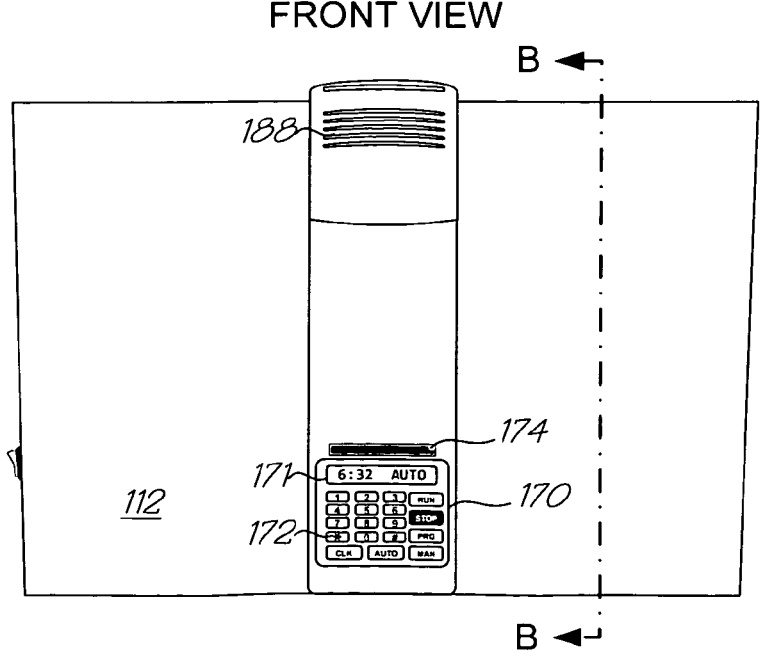
Figure 3C:
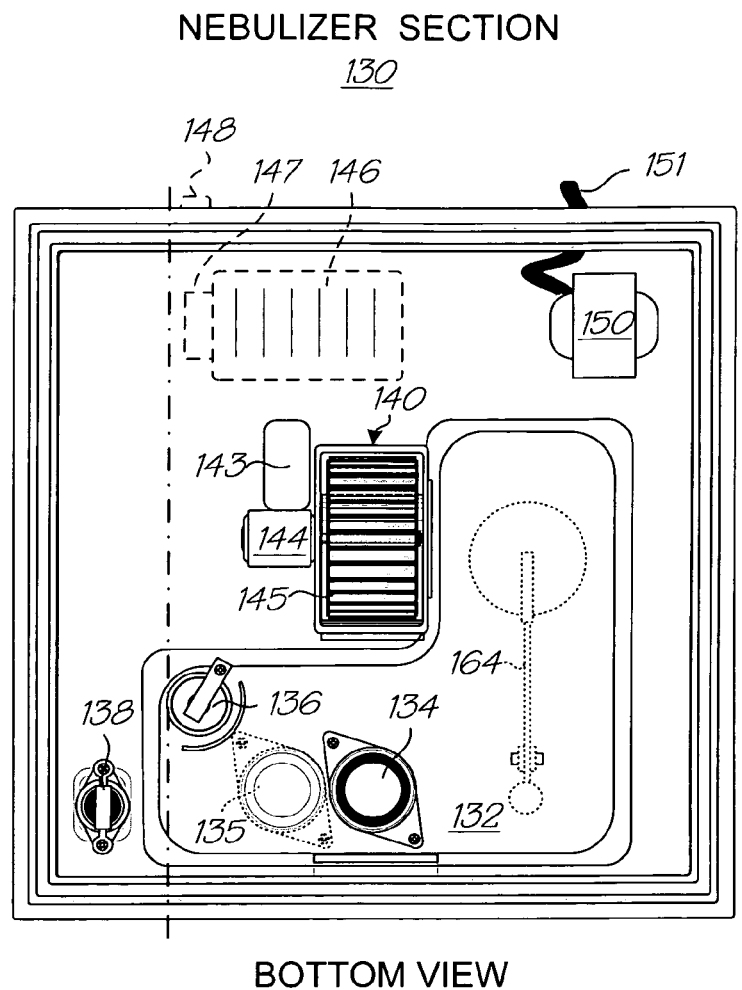
Figure 3D:
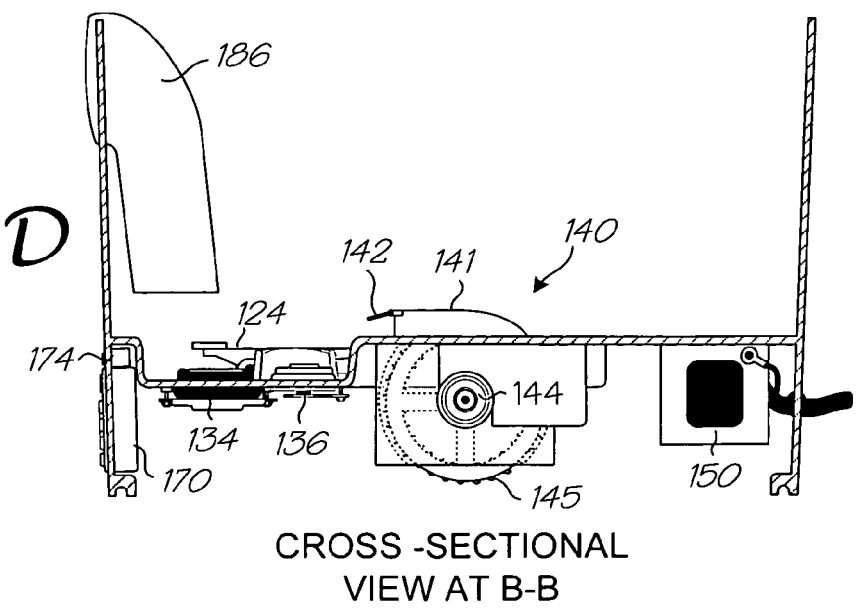
Figure 4A:
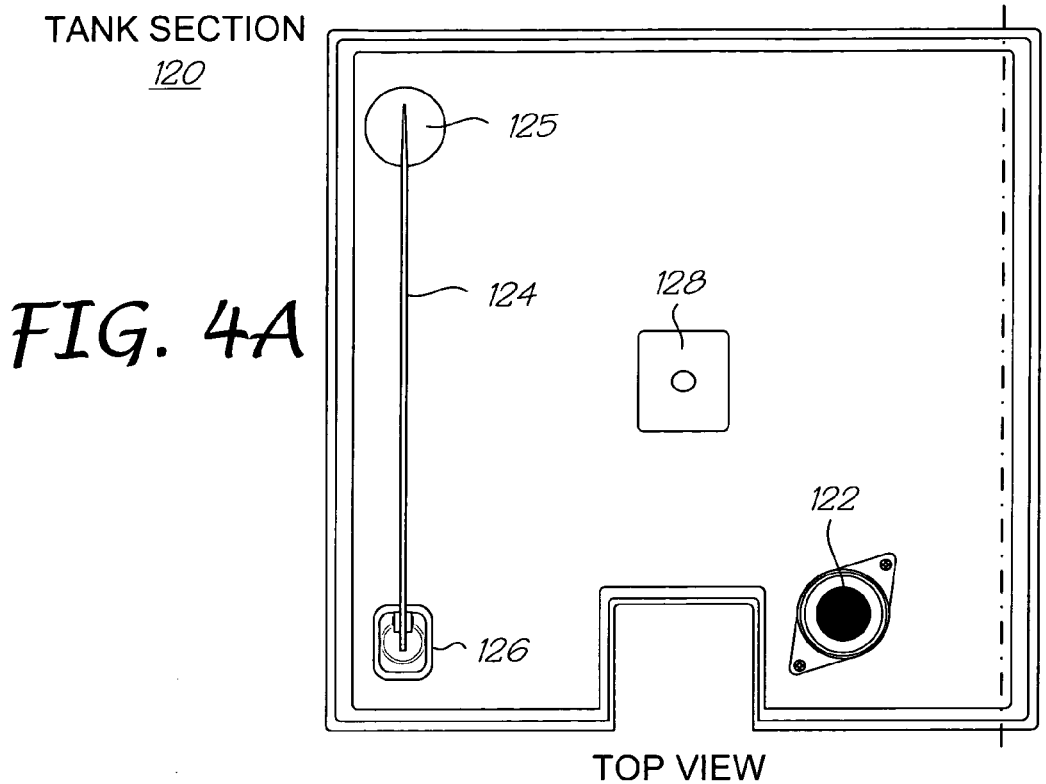
FIGS. 4A, 4B and 4C are diagrams depicting various views of the repellent tank section of a repellent humidifier for exterior use in accordance with an exemplary embodiment of the present invention.
Figure 4B:
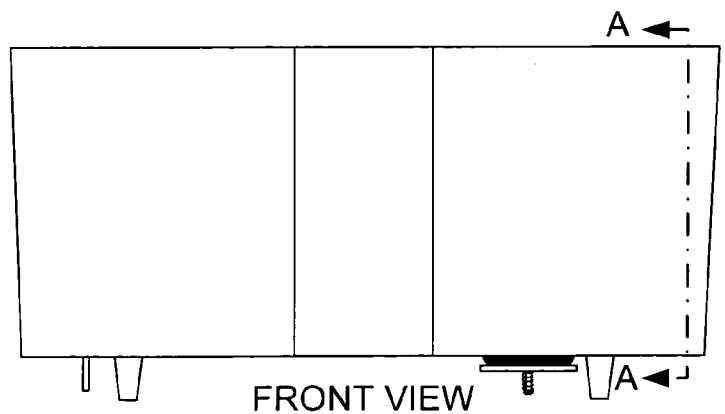
Figure 4C:
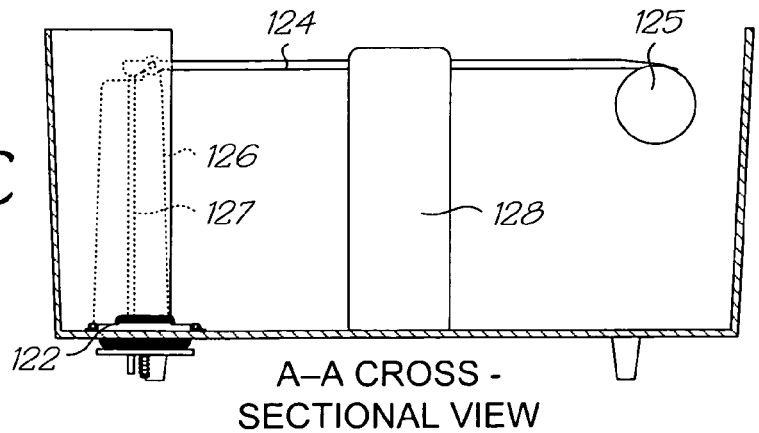
Figure 5A:
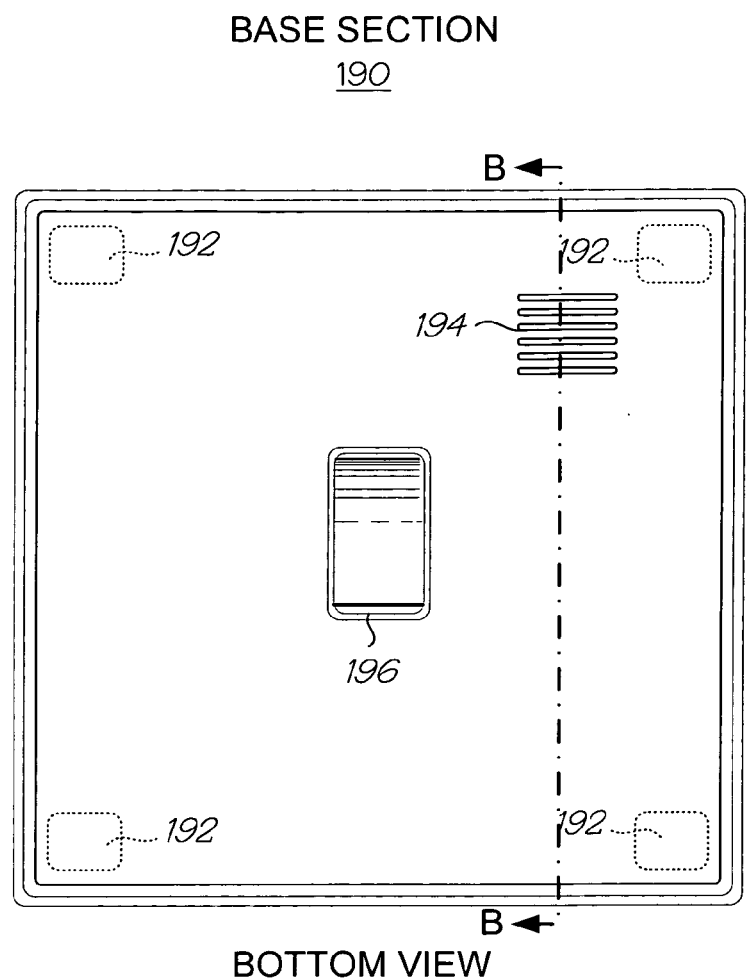
FIGS. 5A, 5B and 5C are diagrams depicting various views of the base section of a repellent humidifier for exterior use in accordance with an exemplary embodiment of the present invention.
Figure 5B:
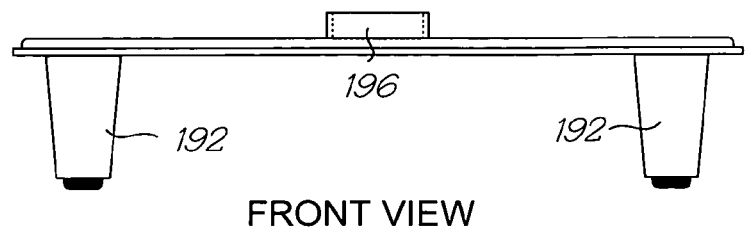
Figure 5C:
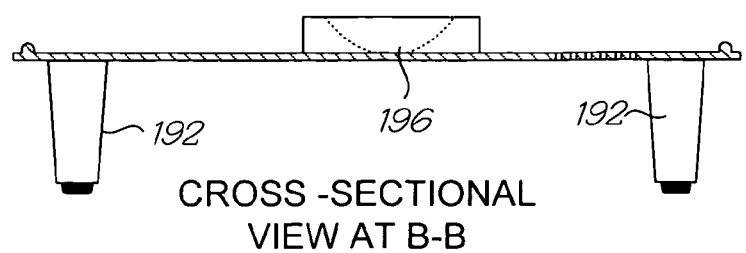

The present invention relates to an ultrasonic humidifier suitable for dispersing repellents for repelling nuisance insects in an exterior environment. FIG. 1 through FIG. 5 are diagrams of the different views of an ultrasonic repellent humidifier in accordance with exemplary embodiments of the present invention. FIGS. 1A and 1B show the front and side views of the external features of repellent humidifier 100. As will be discussed below, repellent humidifier 100 generally comprises four discrete sections: lid section 110; tank section 120 shown in FIG. 4; nebulizer section 130 shown in FIG. 3; and bottom section 190 shown in FIG. 5 (see also the exploded cross-sectional views shown in FIG. 2). Repellent humidifier 100 is an automated repellent dispersing system for exterior usage that is relatively maintenance free. It disperses cool vaporized repellent in the air having particle sizes between 0.03 microns and 15.0 microns depending on the surface tension and viscosity of the repellent and the operating frequency of the ultrasonic transducer. The transducer, which will be discussed in greater detail below with regard to FIG. 8, will operate at the resonance frequency of the piezoelectric crystal it is made from, but optimally will operate between 1600 kHz to 1750 kHz, which may be excited by a drive current oscillating at approximating the resonance frequency of the piezoelectric crystal. In operation, repellent humidifier 100 is intended for exterior use only, therefore all of the components should be sealed and water tight to avoid humidity related failures and should meet Underwriters Laboratories Inc. certification requirements.

Turning to FIGS. 1A and 1B, repellent humidifier 100 has control panel 170 with buttons/switches 172 for programming its operation and display 171 for monitoring inputs and operating parameters. Buttons/switches 172 of control panel 170 is depicted in the exemplary embodiments as being attached to repellent humidifier 100, but in accordance with other embodiments buttons/switches 172 may be an detachable handheld remote for programming control panel 170. For simplicity, all of the processing, memory, control, timing and safety components for repellent humidifier 100 are represented by control panel 170. Optionally, repellent humidifier 100 may have motion sensor 174 for sensing local motion and initiating an automated run sequence for dispensing repellent at vents 188 (depicted in the exemplary embodiment as being a single stationary vent but may be louvered and/or adjustable for dispersing the repellent in a particular direction and/or multiple vents for dispersing mist simultaneously in multiple directions). Tank fill cover 112 is provided in lid 110 that exposes fill opening 114 for replenishing the volume of tank 120 with repellent 121. Tank fill cover 112 is provided with a water resistant sealing gasket for forming a water tight bond with lid 110 and around fill opening 114. As the unit is designed for exterior usage, it will be exposed to direct and indirect ultraviolet (UV) rays from the sun, so the outer shell material must resist ultraviolet light or have a UV protective coating added. Furthermore, repellent 121 may also be sensitive to ultraviolet light, so the entire structure of the unit should be opaque to block harmful UV rays from reaching repellent 121. The inner compartments, tank section 120 should be constructed from chemical resistant material, such as polyethylene, in order to resist damage from repellents. It should be mentioned that although the exemplary embodiment discussed here shows tank 120 above well 132, thereby using a gravity feed for replenishing well 132 with repellant, other configurations are possible without departing from the scope and spirit of the present invention, for instance with the repellant well positioned above the repellant tank, wherein the repellant is moved from the tank to well mechanically using a pump, absorbent wick or dipper (not shown with the exception of the absorbent wick). The use of a mechanical repellant transfer system is particularly advantageous for moving repellant long distances between the tank and well, thus enabling transducers to be position remotely from the repellant tank, thereby allowing for a greater area of repellant protection.

One exemplary repellent for use in repellent humidifier 100 is a composition of geraniol (sometimes referred to as rhodinol which is derived from the Geranium plant but also may occur naturally in lemon, citronella and other essential oils), cedarwood oil and a surfactant (approximate concentrations geraniol 4%, cedarwood Oil 1%, surfactant, such as sodium lauryl sulfate 0.75% with inert ingredients of xanthan gum, citric acid and water in the remaining 94.25%). The insect repelling properties of geranium plants have been long understood and Geraniol, an ingredient extracted from geranium oil, provides a natural, safe and extremely effective insect repellent. Geraniol has been tested by the University of Florida, and has been proven in various laboratory and field tests to be the best available flying insect repellent available, even better than DEET. Geraniol is a natural, pesticide-free product, which requires no EPA registration. Cedarwood oil, which has been touted as being an effective treatment for many hair and skin disorders, congestion and coughs, also has proven repellent properties. In addition, it lends a light musky wood scent to the fragrance of the Geraniol. Because both geraniol and cedarwood oil are lighter than water, a surfactant must be used as a wetting agent that lowers the surface tension of the two oils with the water, allowing for easier mixing and lowering of the interfacial tension between the oils and water. Other natural repellents that may be substituted or used in addition to those above and are listed as inert ingredients eligible for FIFRA 25(b) pesticide products, as well as section 4A ingredients by the EPA are citronella oil (*Cymbopogon Winterianus*), lemongrass oil (*Cymbopogon Citratus*), rosemary oil (*Rosemarinus Officinalis*), Wintergreen oil (*Gaultheria Procumbens*), thyme oil (*Thymus Vulgaris*), cedarwood oil alcohols, cedarwood oil terpenes and sodium lauryl sulfate. Directly below is a partial list of EPA 25(b) exempt active ingredients that have been shown or suspected to possess repellant properties.

TABLE I

| EPA list of 25(b) exempt active ingredients | |
|---|---|
| Castor oil (U.S.P. or equivalent)* | Linseed oil |
| Cedar oil | Malic acid |
| Cinnamon and cinnamon oil* | Mint and mint oil |
| Citric acid* | Peppermint and peppermint oil* |
| Citronella and Citronella oil | 2-Phenethyl propionate (2-phenylethyl propionate) |
| Cloves and clove oil* | Potassium sorbate |
| Corn gluten meal* | Putrescent whole egg solids |
| Corn oil* | Rosemary and rosemary oil* |
| Cottonseed oil* | Sesame (includes ground sesame plant) and sesame oil* |
| Dried Blood | Sodium chloride (common salt) * |
| Eugenol | Sodium lauryl sulfate |
| Garlic and garlic oil* | Soybean oil |
| Geraniol* | Thyme and thyme oil* |
| Geranium oil | White pepper |
| Lauryl sulfate | Zinc metal strips (consisting solely of zinc metal and impurities) |
| Lemongrass oil | |

One disadvantage of using an oil based repellent is that it tends to reduce the effective life expectancy of the ultrasonic transducer and other electrical components. The repellent oil readily adheres to metal surfaces. As the repellent is atomized, a residue of oil and oil byproducts is left on the vibrating part of the transducer (the diaphragm). This coating immediately reduces the efficiency of the energy transfer between the transducer and liquid and left untreated, it thermally isolates the transducer from the liquid, thereby accelerating thermal failure. Another problem is that the humidifier components that come in contact with the repellent vapor will eventually exhibit a thin oil film. While this film is easily cleaned from the exterior, its conductive properties will shorten the life expectancy of high voltage and electronic components it contacts.

In accordance with one exemplary embodiment of the present invention, repellent humidifier 100 comprises nebulizer volume 131 which contains all of the electrical components, has forced ventilation for air cooling, but is isolated from the repellent vapor generated in nebulizer section 130; see nebulizer section 230 of FIG. 3. Nebulizer volume 131 is defined by the horizontal portion and lower sides of nebulizer section 130 and base section 190. As depicted in FIGS. 2 and 3A through 3D, contained within nebulizer volume 131 is transformer 150 that receives AC power from three-pronged external power cord 151 coupled through GFI power switch 152. Control panel 170 that receives power from transformer 150 and both ultrasonic transducer assembly 134 and blower assembly 140 receive controlled power and/or drive currents from control panel 170. Although the present repellent humidifier 100 is depicted as a stationary device that receives power from a household AC power supply, the device consumes relatively little electricity and can, therefore, be powered by optional battery 146 that is recharged via optional battery charger/rectifier 147, or instead receive power directly from a 12 VDC source through optional low voltage input 148. Thus, repellent humidifier 100 may be operated from a car battery for trips to the beach or camping, tailgating or picnicking.

Blower assembly 140 is depicted as comprising motor 144, mechanically coupled to squirrel cage fan 145 and which is enclosed on the lateral and top sides by fan shroud 141. Fan shroud 141 has an air intake inlet (not shown) in a center portion of shroud 141 proximate to the axle of motor 144 and an exhaust outlet above the horizontal portion of nebulizer section 130 (the lowermost portion of the fan shroud is affixed to base section 190, shown in FIGS. 5A through 5C as lower fan shroud 196). That exhaust opening is movably covered by shroud louver 142 when blower assembly 140 is idle, thereby isolating nebulizer volume 131 from any vaporized repellent that may be present in the nebulizer section 130 and protecting the electrical components located therein. Blower assembly 140 is depicted as a squirrel cage fan but may be any type fan system.

Figure 9:
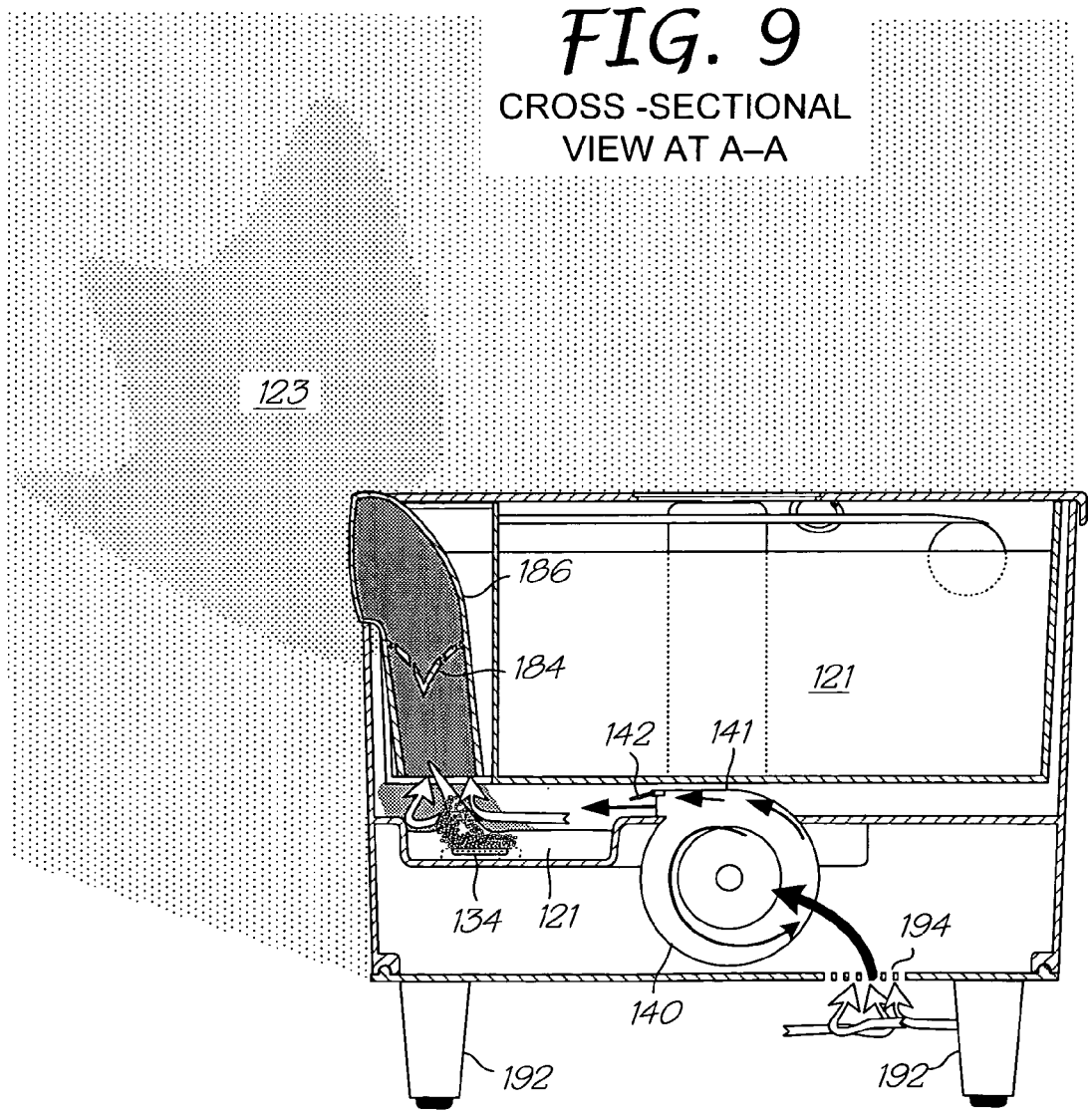
FIG. 9 is a diagram depicting a cross-sectional view of a repellent humidifier showing the air flow and repellent vapor paths in accordance with an exemplary embodiment of the present invention.

Briefly turning to FIG. 9, air from blower 140 is directed toward the surface of repellant 121 in well 132 proximate to the vibrating surface of ultrasonic transducer 134. As repellent is vaporized, it is forced out of well 132 and into the stream of air from shroud 141. Directing the air stream toward the vibrating surface of ultrasonic transducer 134 keeps the upper level of repellent in well 132 agitated, thereby lessening instances of oil and other contaminants adhering to the vibrating surface of the transducer. The repellent vapor mixes with the moving air and is swept upward into vapor duct 186 and egresses repellent humidifier 100 at vapor vents/register 188. While vents 188 are depicted in the figures as stationary openings from a single vapor duct 186, vents 188 may instead be comprised of louvers and/or repositionable register vents for altering the direction and dispersing pattern of the repellent and/or as a plurality of openings from a single vapor duct or multiple vapor ducts.

The present invention is intended to disperse a micro fine vapor of repellent particles into a control area. However, directing the air stream toward the surface of the repellent sometimes causes larger droplets of repellent to enter vapor duct 186 with the repellent vapor. This condition is more prevalent at higher air velocities and with the use of high energy transducers that tend to form tall water cones over the vibrating disc (see FIG. 8A). Repellent adhering to the sides of vapor duct 186 may be also swept out of the humidifier as large droplets of repellent. Any type of dispersal pattern other than a micro fine vapor of repellent particles is an inefficient use of the repellent. Slotted inverted cone-shape diverter 184 may be installed in the throat of vapor duct 186 as shown in FIG. 9. Slots in inverted cone-shape diverter 184 provide high speed paths for channeling micro particles of repellent that are away from the sidewalls and away from the center of the duct. The obstructions along the circumference and center of inverted cone-shape diverter 184 collect larger and slower droplets and provide a path of relatively calm air for the larger droplets to return to well 132 either along the sidewalls of duct 186 or at the center of the cone.

During operation, repellent 121 resides in repellent well 132, completely covering the vibrating portion of ultrasonic transducer assembly 134 and well level sensor 137 (which is electrically coupled to switch 136). At least a portion of well float 165 of float assembly 164 is also immersed in repellent 121 of well 132. Well float 165 tracks the level of the repellent 121; as the repellent is vaporized from well 132, the fluid level drops causing well float contact 163 to engage and actuate tank valve 122 (see FIGS. 5A and 5B). Once actuated, tank valve 122 releases repellent from tank section 120, thereby replenishing repellent 121 in well 132 to a predetermined level (see FIGS. 7A and 7B). Optimally, the level of repellent 121 in well 132 is approximately 1.0 in. to 1.75 in. above the vibrating surface of transducer assembly 134, depicted as distance $h_1$ in FIGS. 6A and 6B.

Those of ordinary skill in the art will readily understand that the present embodiment is exemplary in nature designed for ease in understanding the present invention and than many of the components may be substituted with equivalent components or eliminated altogether. For instance, the mechanical level indicators (tank float assembly 124 and well float assembly 164) described herein may be substituted with electronic fluid level measurement devices. However, one advantage of using a mechanical device for maintaining the repellent level in well 132 is that the well will be filled regardless of whether or not repellent humidifier 100 is connected to an electrical power source. Anytime the repellent evaporates, an oil residue is left on the surfaces. Thus, if repellent 121 evaporates from well 132, a film residue will be left on the upper surface of the transducer, which may lower its efficiency, or worse, lower its operational life.

Figure 6A:
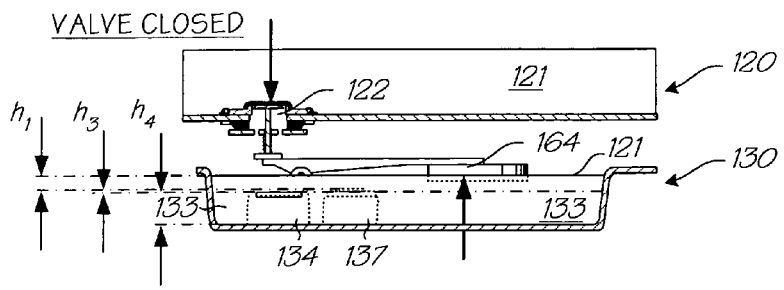
FIGS. 6A and 6B are diagrams depicting cross-sectional views of portions of the tank and nebulizer sections of a repellent humidifier showing the operation of the repellent tank valve in accordance with an exemplary embodiment of the present invention.
Figure 6B:
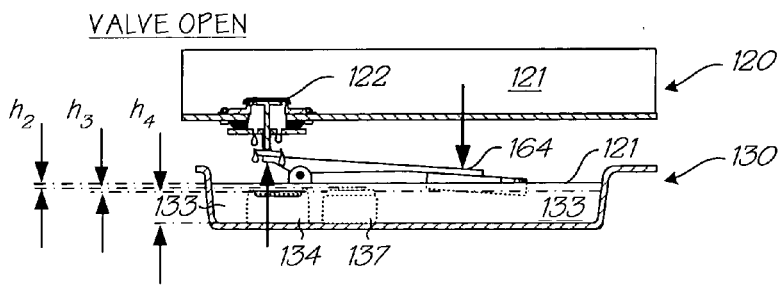
Figure 7A:
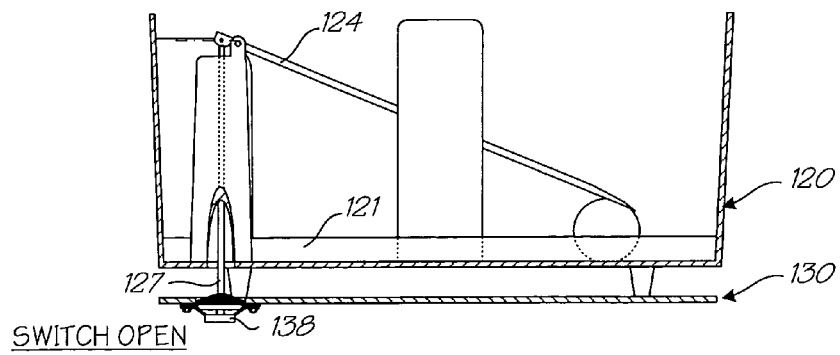
FIGS. 7A and 7B are diagrams depicting cross-sectional views of portions of the tank and nebulizer sections of a repellent humidifier showing the operation of the tank level switch in accordance with an exemplary embodiment of the present invention.
Figure 7B:
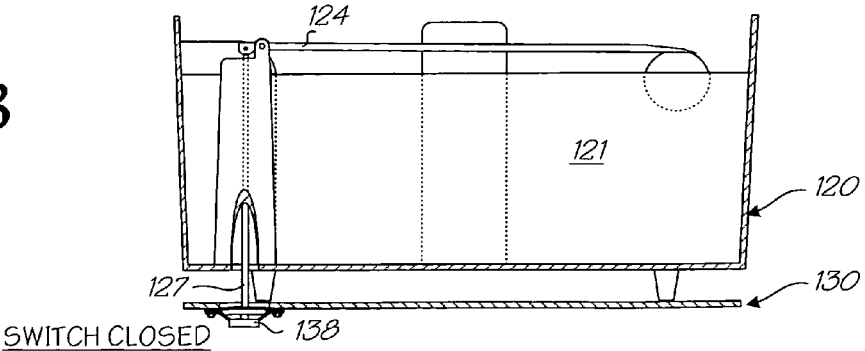

The repellent level in well 132 should remain at least 0.25 in. to 0.5 in. above the vibrating surface of transducer assembly 134, depicted as distance $h_2$ in FIGS. 6A and 6B. Therefore, well float assembly 164 should actuate tank valve 122 where $h_2 > 0.25$ in., preferably 1.0 in.$> h_2 > 0.5$ in. The heat generated by transducer assembly 134 during operation is dissipated by repellent 121 in well 132. If the surface of transducer assembly 134 is uncovered, the transducer will fail in short order. As a safety precaution, well level sensor 137 is positioned approximately 0.125 in. to 0.25 in. above the surface of transducer assembly 134, depicted as distance $h_3$ in FIGS. 6A and 6B. When well level sensor 137 senses well 132 is running dry and the vibrating surface of transducer 134 is in jeopardy of becoming uncovered, i.e., $h_3 \approx 0.125$ in., well level sensor 137 will actuate well level switch 136, which in turn signals control panel 170 to deactivate the ultrasonic transducer. In order to prevent repellent humidifier 100 from cycling on and off, control panel 170 may delay any action until it receives a constant signal from well level switch 136 for five or ten seconds, thereby ensuring that well 132 is running dry and not receiving a false report from well level sensor 137 from being temporarily uncovered by a combination of a low repellent level and turbulence in the repellent from the air flow. Once the signal has been accepted, control panel 170 will then immediately turn off the ultrasonic transducer and flash a low fluid warning across display 171. Control panel 170 may also immediately turn off the blower assembly, or in accordance with another exemplary embodiment of the present invention, control panel 170 may instead delay disengaging blower 140 for a few seconds. By allowing the blower to continue running for a few seconds after the ultrasonic transducer is switched off, any repellent vapor still inside repellent humidifier 100 is exhausted to the atmosphere before it can settle down into nebulizer volume 131 and contaminate the electrical components therewithin. Control panel 170 may run blower 140 for a few seconds following any run cycle to vent repellent vapor from repellent humidifier 100.

Also located within nebulizer volume 131 is tank level switch 138 which is a second safety switch for alerting the user that the repellent tank is in need of refilling, thereby avoiding an unnecessary interruption in dispensing repellent. The low level alert may be any or all of an indicator light, audible alarm and text or error message displayed on display 171. Tank level switch 138 is a spring loaded, normally open switch that protrudes through the horizontal surface of nebulizer section 130 at tank level switch cover 139. Tank switch level cover 139 seals nebulizer volume 131 but does not impede the movement of the switch. Turning to FIGS. 4A, 4B, 4C, 7A and 7B notice that tank float assembly 124 is hingedly attached to float assembly pedestal 126 above the highest level for repellent 121 within tank section 120. Switch actuating rod 127 extends from tank float assembly 124, through the interior of float assembly pedestal 126 and engages tank level switch 138 through tank level switch cover 139. As the level of repellent 121 in tank section 120 recedes, ball 125 tracks the fluid level causing switch actuating rod 127 to move up. At some point, switch actuating rod 127 displaces tank level switch 138 enough to activate the switch and signal the user that the repellent should be replenished.

Tuning again to FIGS. 5A through 5C, base section 190 of repellent humidifier 100 is shown in accordance with an exemplary embodiment of the present invention. Base section 190 seals the lowermost portion of nebulizer volume 131 and should form an air and water-tight seal. When in place, lower fan shroud 196 cooperates with fan shroud 141 of nebulizer section 130 completely enclosing fan impeller 145 except for the intake opening (not shown). Blower assembly 140 draws fresh air from the exterior of repellent humidifier 100 through air vent 194 and into nebulizer volume 131. The fresh air circulates around the electrical components prior to being captured by fan 145 and forces through shroud 141, past open louver 142 and into nebulizer section 130. Because repellent humidifier 100 draws air from beneath base section 190, legs 192 should provide clearance of approximately 2.0 in. In accordance with other embodiments, air vent 194 may be located on a sidewall of nebulizer section 130, below its horizontal surface.

In the exemplary configuration using a single ultrasonic transducer, repellent humidifier 100 will continuously repel insects from a 1,000 sq. ft. control area for thirty hours while consuming approximately two gallons of repellent. Control panel 170 includes a programmable menu for scheduling repellent treatment at a predetermined time, such as in the morning and evening hours of weekends when people are about and insects are most active. Control panel 170 also incorporates a programmable countdown time for activating the device for a preset time period. Then, a user merely activates button 172 labeled AUTO, and repellent humidifier 100 disperses repellent for the preset time period. One method of extending the repellent is by dispersing it in short cycles for a preset time period, rather than in a continuous dispersion, for instance alternating cycles of ten minutes ON and five minutes OFF, or cycles of five minutes ON and ten minutes OFF. Alternatively, a manual override RUN button may also be included for running the unit longer than the preset time period. Humidifiers designed for internal use will often have a moisture sensitive rheostat for deactivating the run cycle at a predetermined relative humidity, and thus not inducing too much moisture into the air. Because repellent humidifier 100 is designed for outdoor use, sensing the surrounding relative humidity may be of little importance since the outdoor relative humidity would probably override the dispersing time period causing the device to shut off too early, especially in humid climates. Furthermore, because the present invention disperses micro fine particles of repellent, only a small amount of repellent is necessary for controlling nuisance insects, and the moisture content of the ambient air (the relative humidity) may not be affected. Instead, repellent humidifier 100 may include an optional motion detector 174 for sensing movement and dispersing repellent in conjunction with movement. This feature is even more important for use in areas that need insect control when humans are not present to activate the device. These are places where parasitic insects may be attracted for nonhuman hosts, and may transmit Lyme disease, heart worms, viral encephalitis, Eastern and Western equine encephalitis, West Nile virus and the like to their nonhuman hosts. Included in these places are aviaries, barns, kennels, stables and dairies.

As depicted in the figures of the exemplary embodiments, tank section 120 will accommodate one and a half to four gallons of repellent, but in accordance with other exemplary embodiments of the present invention the tank may hold ten or more gallons of repellent. Repellent humidifier 100 is depicted as having only a single ultrasonic transducer 134. The exposed portion of the vibrating surface should be approximately 2.0 in. in diameter to vaporize enough repellent to efficiently repel insects from a 1,000 sq. ft. control area. In accordance with other exemplary embodiments depicted in FIGS. 3A and 3C, the repellent humidifier may be configured with multiple ultrasonic transducers, either to increase its capacity or longevity. There, exemplary ultrasonic transducer 134 is depicted as being supplemented with a second transducer, exemplary ultrasonic transducer 135, but others may also be included. In accordance with one exemplary embodiment, the multiple ultrasonic transducers may be activated simultaneously in order to increase the capacity of the unit for control areas greater than 1,000 sq. ft. Alternatively, the multiple ultrasonic transducers may be activated alternatively in order to extend that time between transducer services. The present configuration of repellent humidifier 100 may be further optimized by using a dual speed blower for more rapidly dispersing repellent at start up. After a predetermined time has elapsed, the blower reverts to its normal and slower run speed.

Figure 8A:
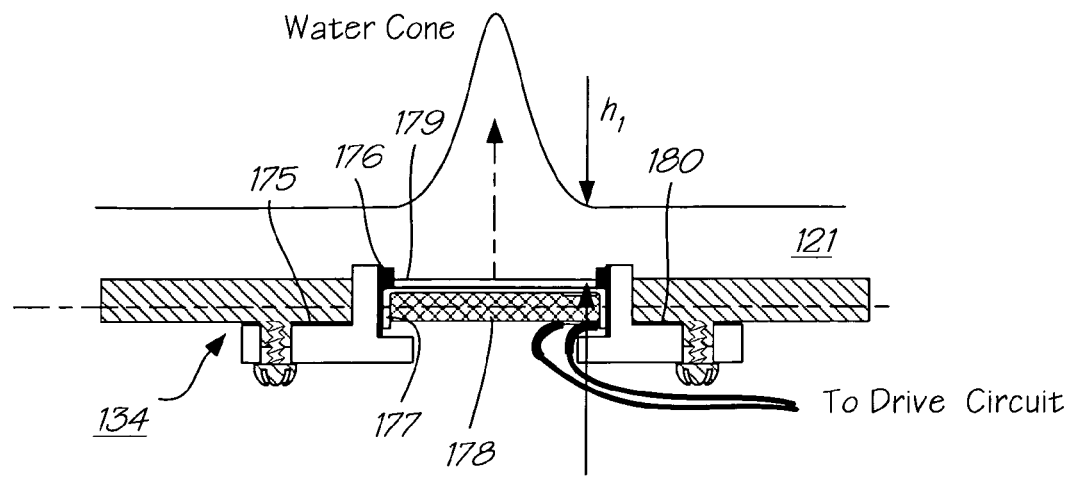
FIGS. 8A, 8B and 8B are diagrams depicting cross-sectional views of an ultrasonic transducer installed in a portion of the nebulizer section of a repellent humidifier showing in accordance with various exemplary embodiments of the present invention.
Figure 8B:
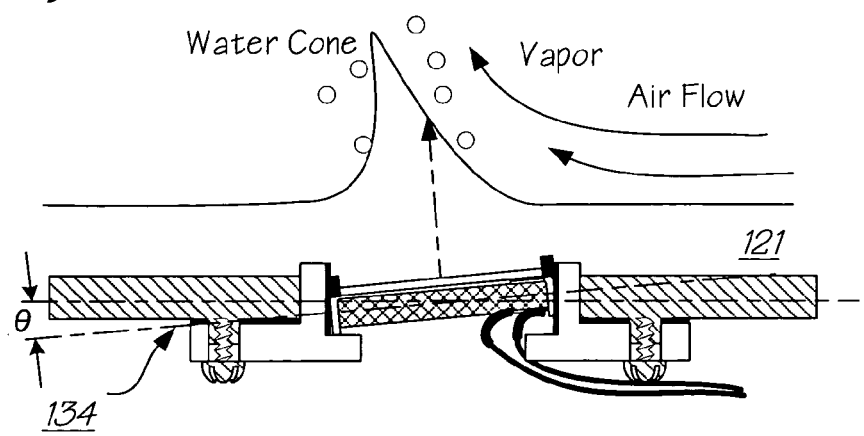
Figure 8C:
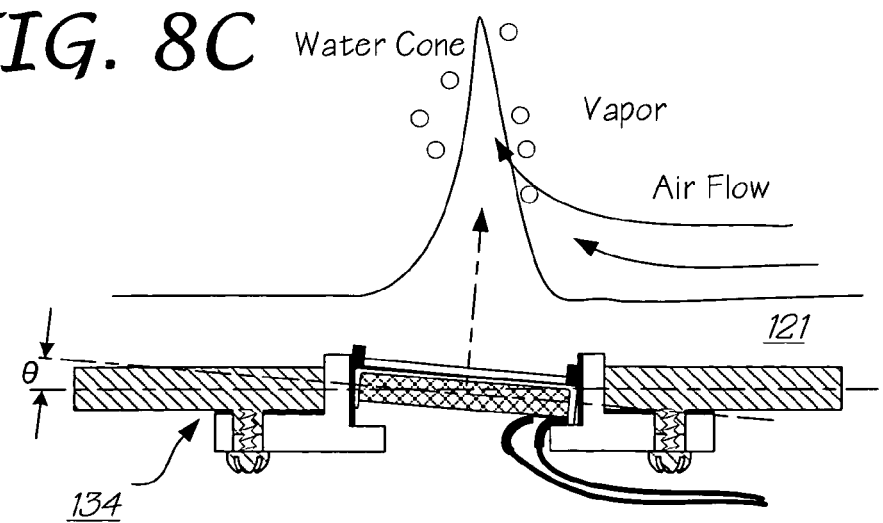

Turning now to FIGS. 8A, 8B and 8C, the construction and operation of an ultrasonic transducer is shown in accordance with exemplary embodiments of the present invention. As mentioned elsewhere above, ultrasonic transducers for vaporizing water abound and are extremely well known. However, those designs are intended for interior usage and for vaporizing water having a purity consistent with drinking or pool water. Using such humidifier designs out-of-doors for oily repellents will result in failure from a variety of factors. All else being equal, the purity of the air ingested by the present repellent humidifier also presents a serious challenge as outdoor air contains large concentrations of dust, pollen, spores, mold and bacteria not usually present indoors. These contaminants present two separate problems: hygiene and maintenance. One solution to molds and bacteria is to deposit aqueous silver ions to well 132, such as by using the Ionic Silver Stick water purification technology (Ionic Silver Stick is registered by and available from Plaston AG of Switzerland). These silver ion cartridges last approximately one year and then must be replaced. Additionally, the interior surfaces of the humidifier may be coated or impregnated with an antimicrobial substance such as Microban (Microban is registered to and available from Microban International Ltd. of New York, N.Y.).

Even though these solutions will suppress the growth of harmful bacteria, mold and some viruses, they do little to stem the inordinate amount of contaminants ingested into the unit from the air stream. Obviously, filtering air at air vent 194 will reduce the amount of contaminants entering the system, but a filter adds an additional maintenance item for the user. As a practical matter, the vast majority of contaminates will travel straight through the device, and while they will have an effect on particle size, they will not reduce the effectiveness of the particle size to any measurable amount. Some particles will, however, be captured by liquid repellent 121 in well 132. Those contaminants are first addressed by the design of well 132. A reservoir well in a typical humidifier is usually an inch deep or less. The vibrating surface of the ultrasonic transducer is positioned near the bottom of the well (with the exception of perhaps the fluid level indicator, the transducer is near the deepest portion of the reservoir). Any contaminates captured in the water of the reservoir will settle out and saturate the bottom of the reservoir, while the upper level of the reservoir water will be relatively free of contaminates. The contaminants will cover the vibrating surface of the transducer and after periods of inactivity, the contaminants will adhere to the transducer, thereby lowering its efficiency. The oils and oil byproducts in the repellent further bind the contaminants to any metal surfaces present in the well, such as the transducer diaphragm.

This problem is partially overcome in the present invention by providing a sump below the level of the vibrating surface of the transducer. Turning again to FIGS. 6A and 6B, the depth of the water column above the vibrating surface of the transducer is shown as $h_1$ and $h_2$, depending on the level of water in the well. Sump distance, shown as $h_4$, is typically only a few millimeters in prior art humidifiers, perhaps up to 0.25 in. In accordance with an exemplary embodiment of the present invention, the depth of sump 133 $h_4$ is deepened to create a low energy environment conducive to holding contaminates. In the present invention, sump depth $h_4$ may exceed 1.0 in. depending on the air velocity and the type and concentration of contaminates in the air. While the bottom of the sump 133 in well 132 must be cleaned from time to time, the cleaning frequency is much less than the maintenance cycle of the ultrasonic transducer.

The second solution to contaminates, and for anything that might stick to the vibrating surface of ultrasonic transducer assembly 134, is to select a nonstick surface that does not inhibit the transfer of ultrasonic energy to the repellent or causes heat to accumulate in the piezoelectric crystal of the transducer. Turning now to FIG. 8A, ultrasonic transducer assembly 134 is shown in accordance with an exemplary embodiment of the present invention. Ultrasonic transducers take many forms, but the exemplary transducer comprises mounting case 175 with a flanged opening for securely holding the transducer in place. Mounting case 175 is secured to the bottom of well 132 by fasteners with seal/o-ring 180 there between. The transducer comprises piezoelectric crystal 178 that converts electrical energy to high frequency mechanical energy (inaudible sound) and is usually silver soldered to a pair of electrical leads. Piezoelectric crystal 178 is not usually exposed to the water in humidifiers but is separated by metal disc 177 (the disc may be of any shape and in some applications a screen is substituted for a solid disc). The disc may actually be in the form of a cap or encase the entire piezoelectric crystal. The energy created by piezoelectric crystal 178 vibrates metal disc 177, causing the water to cavitate. Piezoelectric crystal 178 and metal disc 177 are held securely by UL approved transducer seal 176 that surrounds the opening in mounting case 175. Metal disc 177 is typically fabricated from stainless steel, nickel plated or layered steel, or titanium. In either case, the oils and oil byproducts of the repellent readily adhere to the surface of metal disc 177 and its efficiency rapidly degrades. It appears that the metal surface attracts the oils and/or repels the surfactant in the repellent, resulting in an oil residue on the metal. The oil residue can usually be cleaned, but adds another maintenance item for the user. Oil mixed with airborne contaminants, and biological material is far more stubborn to clean. Often, the most expeditious solution is to simply replace the entire ultrasonic transducer assembly 134, thereby greatly increasing the cost of operation of the unit. In accordance with an exemplary embodiment of the present invention, piezoelectric crystal 178 is separated from repellent 121 by ceramic disc 179 rather than the metal jacket. The repellent oils and oil byproducts are not attracted to the ceramic material in the manner of the metal disc and the surface of the ceramic disc remains pristine longer. Contaminants and particulate matter that does settle on ceramic disc 179 does not adhere to the ceramic to the extent as with the metal. In most cases, any oil residue that is present can usually be brushed off of the surface of ceramic disc 179 without replacing it. Metal disc 177 may be interposed between piezoelectric crystal 178 and ceramic disc 179 without any loss of efficiency. Therefore, in accordance with still another exemplary embodiment of the present invention, ceramic disc 179 may be separately replicable from piezoelectric crystal 178. In that case, ceramic disc 179 may be separately cleaned or replaced without disturbing ultrasonic transducer assembly 134 and without incurring the costs.

As mentioned elsewhere above, during operation ultrasonic transducer assembly 134 forms a water cone that tends to induce the formation of larger sized particle droplets. The force of the forced air from blower 140 sweeps these large repellent droplets into the exhaust duct 186 and out of the machine causing a spray of repellent. Aside from using a diverter in the duct, ultrasonic transducer assembly 134 can be oriented for maximum vapor product with a minimally sized water cone. Cavitation efficiency is severely decreased as angle θ diverges from horizontal. On the other hand, the size of the water cone in the air stream can be decreased by increasing angle θ in the direction of the air stream, see FIG. 8B. With the water cone oriented away from the air stream, less repellent is spattered and drawn up into the duct as large sized droplets. Decreasing angle θ in the direction of the air stream tends to build the water column like an offshore breeze causes ocean waves to build, see FIG. 8C. Not only is the water column taller with more surface area for creating larger droplets, but it presents a larger obstacle to the air stream that induces a low pressure zone on the backside of the water cone that is further conducive for droplet formation. Therefore, piezoelectric crystal 178 and ceramic disc 179 should be oriented slightly in the direction of the air flow, thereby reducing the size of the water cone. Optimally, angle θ should be between 5.0 and 9.0 degrees, preferably around 7.0 degrees off horizontal.

Another advantage of the present ultrasonic repellent humidifier is its portability. Ultrasonic repellent humidifier 100 can be repositioned to various locations on the user's property depending on the need for repelling insects. In accordance with some aspects of the present invention, the device is battery powered, thereby further increasing portability. Portability is further realized in a lighter, more compact ultrasonic repellent humidifier that can be conveniently carried to events such as picnics, tailgating, camping, fishing, golfing, the beach, hiking, woodlands, outdoor concerts, plays, recitals and staged events and spectator sports. Optimally, the ultrasonic repellent humidifier is light, durable, energy efficient, battery powered and adaptable to a variety of power sources, while achieving vaporization of significant quantities of repellant.

Figure 10A:
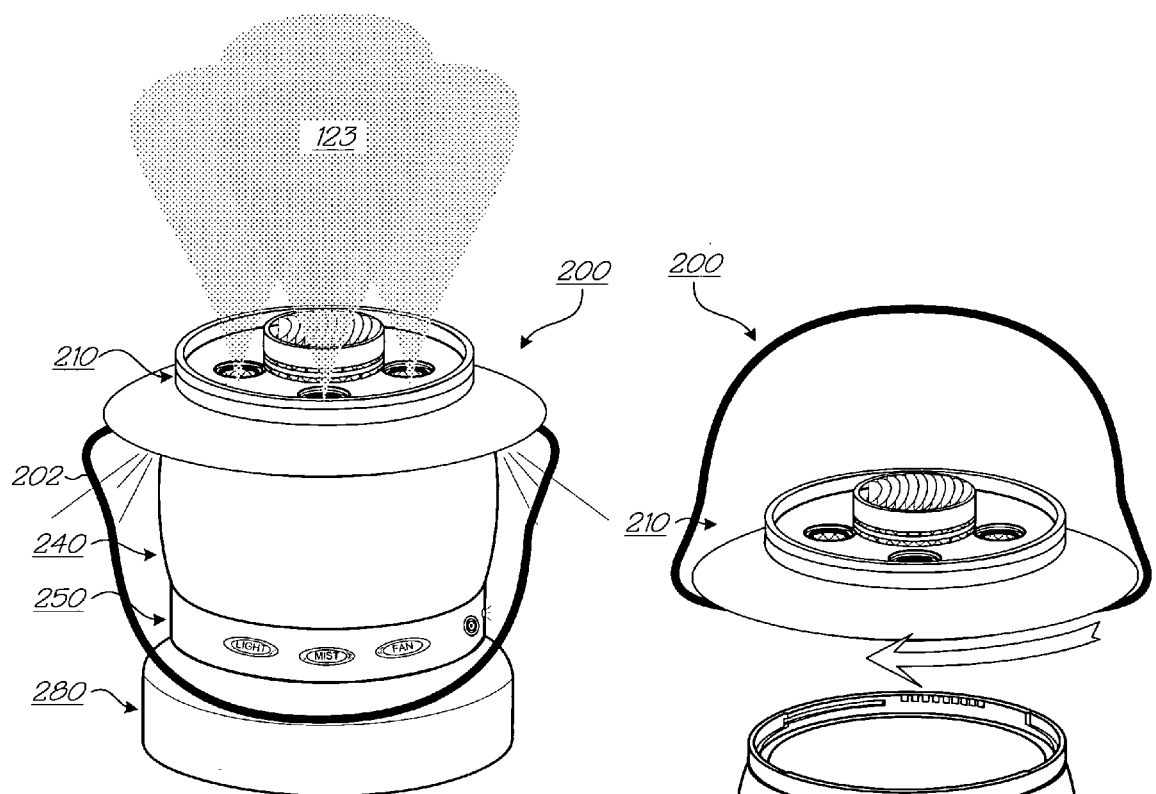
Figure 10B:
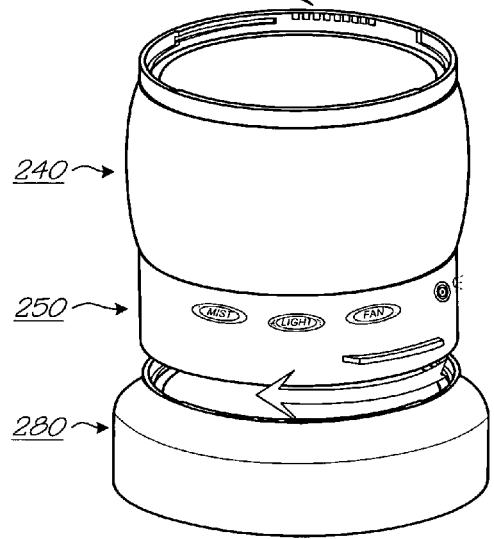

FIGS. 10A, 10B and 10C are diagrams of a portable ultrasonic repellent humidifier in accordance with exemplary embodiments of the present invention. Essentially, portable ultrasonic repellent humidifier 200 generally comprises four primary sections or assemblies: nebulizer assembly 210; tank assembly 240; control assembly 250 and base or battery assembly 280. It should be appreciated that while the shape of portable ultrasonic repellent humidifier 200 is suggestive of a lantern, its general proportions, dimensions and utility are highly adaptable for dispersing repellant vapors, i.e., compact size for easy placement on picnic tables, car roofs, tailgates, bleachers, turf, chairs, or wherever, a wide base to lessen tipping, a large interior volume for accommodating an adequate quantity of repellant, a handhold such as handle 202 for transporting and for securing repellent humidifier 200 to tree limbs, twine, canopies, etc., for higher vantage points, and an adaptable power source, such as a long life battery, and/or a universal power connection, that is a single power jack (power jack 291) adaptable to a variety of power sources, USB power adapter 292A, 12 VDC car power adapter 292B; 110 VAC power adapter 292C and regulated solar panel 292D. If battery powered, portable ultrasonic repellent humidifier 200 may utilize a variety of battery options, such a four, six or eight C- or D-cell disposable batteries, a rechargeable, sealed and maintenance free lead acid battery, such as RBC5, RBC9, RBC22, RBC32 or the like that are commonly used in UPC battery backup devices, rechargeable NI-CAD battery packs, such as are commonly used in portable power tools and even more expensive, but high performance and reliable, lithium ion battery packs. Optimally, portable ultrasonic repellent humidifier 200 operates in a voltage range between 4.4 volt and 14.0 volt to accommodate 4.4 volts from a USB port up to the 13.8 volts readily produced by "12V" lead acid batteries.

Additionally, because portable ultrasonic repellent humidifier 200 will not be used daily, it should be uncomplicated to operate and service. For instance, in accordance with one exemplary embodiment of the present invention, repellent humidifier 200 comprises as few as a single easily understood tactile button (optimally a plurality of buttons) and the repellant tank can be replenished by merely uncoupling nebulizer assembly 210 from tank assembly 240, thereby exposing the inner volume of the repellant tank. Spend batteries can be replaced in a similar fashion by uncoupling control assembly 250 from battery assembly 280, thereby exposing the battery compartment and batteries.

The operation of the nebulizer assembly will be better understood from a discussion of it components. FIG. 11 is an exploded diagram of repellent humidifier 200 that further illustrates a highly decomposed view of nebulizer assembly 210 in accordance with another exemplary embodiment of the present invention. To the left of the diagram is the mechanical-electrical cooperation between control assembly 250 and battery assembly 280 can be appreciated (a more decomposed view will be discussed below with regard to FIGS. 13A and 13B). Repellant 121 is present and sealed in the interior of tank assembly 240 from egressing nebulizer assembly 210 via tank seal 246. Exemplary nebulizer assembly 210 is formed from three structural components: upper surface 232 (with mounting surface for an optional fan), mounting housing 231 (with optional sockets for holding LED lamps and/or fan inlet (not shown) and transducer mounting surface 230. Transducer mounting surface 230 is secured within mounting housing 231 by some waterproof means (either glue, ultrasonic welds or fasteners with outer seal in order to allow the lower edge of mounting housing 231 to seal on seal 246 without allowing liquid repellant to escape onto the upper surface of transducer mounting surface 230. Upper surface 232 is coupled to mounting housing 231 using a twist-lock coupler (similar to the coupler between control assembly 250 and battery assembly 280 and between nebulizer assembly 210 and tank assembly 240) or removable fasteners, thereby enabling the operator access to the ultrasonic transducer(s) for maintenance.

In the present configuration, repellant 121 in tank assembly 240 is below the ultrasonic transducer(s), therefore the repellant is transmitted to the transducers for vaporization. Two primary methods exist: pumping (either using a mechanical pump or by pressurizing the repellant tank); or wicking using an absorbent wick. Pumps and pressuring devices are complicated, expensive, somewhat unreliable and drain the already limited power from the source. Wicks, on the other hand, are relatively uncomplicated, reliable and inexpensive. Wicking the repellant to the transducer requires only that the wick be exposed to the repellant, the greater the coverage the less capillary effect is necessary for transmission (although intermittent lapses will not affect the performance of the device if the wick is saturated), and the upper surface remain in contact with the surface of the transducer. In accordance with one exemplary embodiment of the present invention, rather that evaporating the repellant from a vibrating solid surface as discussed elsewhere above, here the repellant is drawn through tiny holes, slots, perforation and mesh in the vibrating surface of the transducer which, in turn, evaporates the repellant directly from the interior of the wick.

Before discussing exemplary repellant well and wick assembly 220, turn to FIGS. 12A, 12B, 12C and 12D for a brief discussion of exemplary ultrasonic transducer. In contrast with the transducer designs discussed above which evaporate liquids above the vibrating surface, ultrasonic transducer for wick-type humidifiers essentially evaporate the liquid in the upper portion of the absorbent wick. Hence, the vibrating surface of the transducer should be in contact with the wick, usually at the upper end surface, and should have a path for the vapor to escape. In accordance with various exemplary embodiments of the present invention, the vibrating surface of the ultrasonic transducer is permeable to vapors. FIGS. 12A and 12B (FIG. 12A depicting a top view and FIG. 12B depicting a side view) illustrate an ultrasonic transducer having a round vibrating surface, while FIGS. 12C and 12D (FIG. 12C depicting a top view and FIG. 12D depicting a side view) illustrate another ultrasonic transducer design having a linear-shaped round vibrating surface, however the external shape of the vibrating surface is not necessarily limiting to the presently described invention.

Turning to the exemplary embodiment of the transducer structure depicted in FIGS. 12A and 12B illustrate an ultrasonic transducer with a vibrating surface 215A juxtaposed to transducer (piezoelectric crystal) 214A with conductors leads 216A attached. Notice from the illustration that piezoelectric crystal 214A has an opening that exposes a permeable surface portion of vibrating surface 215A. Optimally, permeable vibrating surface portion 213A contacts an end of absorbent wick 221 and, therefore, for maximal efficiency the area of permeable vibrating surface portion 213A should be coextensive or slightly larger than the area of the end of absorbent wick 221. Wick 221 may be of virtually any length, longer lengths allow for a deeper repellant tank and more capacity, however the capillary effect becomes less efficient in delivering high amount of repellant to the transducer in excess of a foot. The permeable portion of the vibrating surface may be perforated, slotted, a mesh of small opening in vibrating surface 215A sufficiently large to allow vapor to traverse vibrating surface 215A, yet leaving enough surface material for efficient propagation of the oscillation energy. One optimal means for manufacturing the permeable portion into a vibrating surface is by selecting a perforation pattern over the portion of the vibrating surface where permeability is desired and laser etch the pattern through the vibrating surface. For optimal connectivity between vibrating surface 215A and transducer (piezoelectric crystal) 214A, the permeable portion should not extend beneath the area in contact with piezoelectric crystal 214A. In operation, this transducer design emits a medium velocity cone-shaped stream of repellant vapor in a direction generally opposite the absorbent wick. Additionally, while FIGS. 11, 12A and 12B generally suggest that vibrating surface 215A is oriented in a nearly horizontal plane, in practice each vibrating surface 215A on portable ultrasonic humidifier 200 may be oriented off horizontal in order to disperse the cone-shaped streams of repellant vapor away from each other and in a wide dispersion pattern about portable ultrasonic humidifier 200 (easily over forty-five degrees without suffering any operational inefficiency).

With regard to the exemplary embodiment of the transducer structure depicted in FIGS. 12C and 12D, the diagrams illustrate another ultrasonic transducer with vibrating surface 215B juxtaposed to transducer (piezoelectric crystal) 214B with conductors leads 216B attached. However, rather than the coextensive portions of piezoelectric crystal 214B and vibrating surface 215B having an open circular area, here the contact surface is closed with cantilever permeable vibrating surface portion 213B extending from the contact area in the cantilevered appendage. In this embodiment, optimally permeable vibrating surface portion 213B should contact only an end of absorbent wick 221 in order to transfer all of the oscillation energy to the repellant in the wick, but may be larger and non-coextensive with the wick end.

Figure 11:
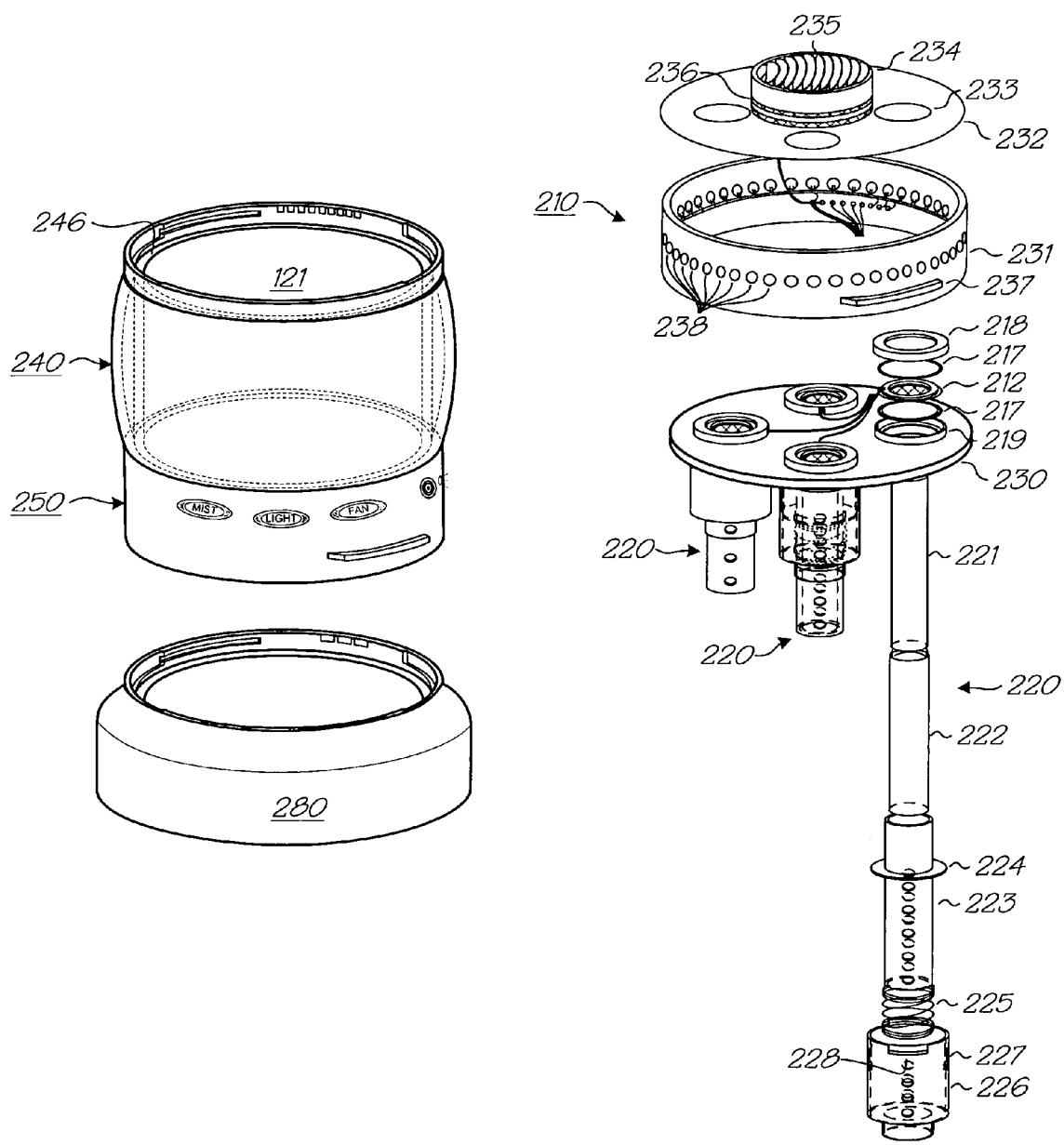
FIG. 11 is an exploded diagram of repellent humidifier 200 that further illustrates a highly decomposed view of nebulizer assembly 210 in accordance with another exemplary embodiments of the present invention.

Returning now to FIG. 11, concentric transducer assembly 212 is secured into transducer well 219 on transducer mounting surface 230 by transducer assembly retainer 218 that mechanically couples to the seat and/or transducer surface, thereby securing concentric transducer assembly 212. Transducer seals 217 provide a fluid proof seal to prevent leakage of repellant onto the top surface of transducer mounting surface 230. Repellant well and wick assembly 220 (for brevity, herein after referred to as wick assembly 220) operates as a repellant well by using an absorbent wick to hold liquid repellant for the transducer. Wick assembly 220 mechanically couples to the under side of transducer well 219 using a pair of male support housing couplers 228 that cooperate with a female coupler on the transducer seat (not shown). FIG. 11 depicts portable ultrasonic humidifier 200 having four transducers and corresponding wick assemblies, however any number that will fit within the confines of the surface area are possible. With further regard to wick assembly 220, its purpose is to enable wick 221 to traverse the distance between concentric transducer assembly 212 and the repellant, preferable to the bottom of the repellant tank. Absorbent wick 221 pulls repellant from the repellant tank against gravity using the well-known capillary affect. Hence, absorbent wick 221 should be fabricated from a material having a relatively high longitudinal permeability to repellant and a somewhat lower lateral permeability to the repellant. Absorbent wick 221 may be fabricated from a variety of materials, typically nonorganic due to undesirable reaction between organic materials and the repellant, most common of which are oriented longitudinally in a loosely packed cylindrically shaped wick. Alternatively, the wick material may be a foam having similar flow properties. In any case, wick 221 should remain biased to permeable vibrating surface portion 213A of transducer assembly 212 by a few ounces per square inch of pressure. This is accomplished, in accordance with one exemplary embodiment of the present invention by using wick support housing 223 that is received into spring compression housing 226 for retaining a biasing member in a compressed state, such as exemplary wick support housing spring 225, essentially between support housing lock ring 224 on wick support housing 223 and the bottom surface of spring compression housing 226. The upper movement of wick support housing 223 within spring compression housing 226 is controlled by a pair of lock ring catches 227 that confine movement of support housing lock ring 224. As mentioned above, wick support housing spring 225 need only apply a few square ounces of pressure on wick 221 once installed on transducer mounting surface 230. Optionally, wick support housing 223 may be fitted with wick screen/filter 222 between wick support housing 223 and wick 221 to further filter contaminants from being absorbed into the wick.

Wick support housing 223 is retained in mounting housing 231, which optionally may include fixtures for receiving a plurality of LED bulb 238 (as a practical matter, LED bulbs may be electrically configured in banks of lights for efficiently distributing power from the battery). Upper surface 232 is received around transducer assembly retainers 218 at transducer openings 233. Optional fan 234 may be disposed on upper surface (fan mounting surface) 232 which redirects air from fan inlets 236 across adjustably rotatable louvers 235 for dispersing repellant vapor. Alternatively, the fan inlets may be disposed along mounting housing 231 allowing fan 234 to draw air from within mounting housing 231. In either case, the fan louver design enables a wider, more directed dispersion of repellant in a desired direction.

Power for optional fan 234 and optional lights 238, along with transducer signals are controlled within control assembly 250. The relationship between base/battery assembly 280, control assembly 250 and tank assembly 240 are graphically represented in FIGS. 13A and 13B in accordance with other exemplary embodiments of the present invention. Essentially, tank assembly 240 comprises repellant tank 242 surrounded and supported by outer housing 241. Outer housing 241 has three major functions: it provides structural support for repellant tank 242; a conduit for conductors 244 between control assembly 250 and transducer mounting surface 230; and female tank assembly coupler 245 for cooperating with male mounting housing coupler 237. Additionally, a plurality of electrical contacts 243 are provided, each of which corresponds to respective conductor 244 for electrically coupling tank assembly 240 with control assembly 250. Tank seal 246 prevents repellant from escaping tank 242. As a practical matter, outer housing 241 and the structure of control assembly 250 may be fabricated as a single unit, or as two pieces and joined or welded together. Surfaces that may contact the repellant should be highly reactive, thus some more economic plastics such as PVC and ABS may not be suitable. One exemplary material which is highly non-reactive to repellants is Viton, which is a registered trademark of and available from the DuPont E.I. DE Nemours & Company, Delaware, USA.

Control assembly 250 generally holds the electrical components securely in close proximity to battery assembly 280 with conductors 254 electrically coupled to tank assembly 240, via optional electrical contacts 253 for signals and operating power, and to electrical contacts 283 on battery 282 to the battery for receiving battery power and for charging the batteries. Essentially, exemplary control assembly 250 comprises a plurality of transducer driver circuits (depicted herein as 262A, 262B, 262C and 262D, which may also be disposed within mounting housing 231 and adjacent to the respective transducers), power controller/recharger 260 for receiving electrical power from any of adapters 292 via power receptacle 252, switches 251 for respectively controlling one of the ultrasonic transducers, optional fan and/or optional lights, and transducer/fan/light controller 261, electrically coupled to switches 251 and power controller/recharger 260 for transforming user inputs to switches 251 into operating signals for one or all of transducers 212, fan 234 and lights 238. Alternatively, transducer/fan/light controller 261 may be a more complex unit that utilizes power level information from power controller/recharger 260 and then efficiently meters electrical power to selected ultrasonic transducers and/or distributes power between multiple ultrasonic transducers and/or a fan and/or multiple banks of LED lights based on the power available to the device. In order to efficiently utilize electrical power and repellant, transducer/fan/light controller 261 may operate in several modes, a full power mode to distribute a maximum amount of repellant vapor and a reduced power or kick-down mode that deactivates one or more ultrasonic transducers after a predetermined time period. The kick-down operating mode not only saves electrical energy, but also reduces repellant usage to a maintenance level after the protected area has been effectively permeated by repellant. Additionally, because the presently described portable repellent humidifier may not utilize a repellant level detector, transducer/fan/light controller 261 may also include an internal timer for automatically deactivating the ultrasonic transducers after a predetermined time period to avoid transducer damage from running dry of repellant. Optimally, transducer/fan/light controller 261 will initiate an alert signal (either audible, visual or both) to the operator who then checks repellant level in repellant tank 242 and refills as necessary, and then restarts vaporization.

In accordance with still another exemplary embodiment, transducer/fan/light controller 261 may efficiently distribute power to the different electrical components based on the battery's charge. For example, at full battery charge or adapted to line power, transducer/fan/light controller 261 will activate all ultrasonic transducers, the highest fan speed and all banks of lights simultaneously. However, as the power available to portable repellent humidifier 200 decreases, transducer/fan/light controller 261 prioritizes power output. For instance, at 90% remaining power, all ultrasonic transducers will receive power, but only 50% of the power to the fan and lights is available (the highest fan speed and no lights, or all banks of lights and no fan, or half the light banks and half fan speed). At 80% available remaining power, all ultrasonic transducers will receive power, but only 25% of the power to the fan and lights is available (the medium fan speed and no lights, or one bank of lights and no fan). Additional fan and lighting capacity will be available if the user reduces the number of ultrasonic transducers activated. Ultimately, at low power LED light will be activated by transducer/fan/light controller 261. This power protocol is automatically instantiated. As less power is available from the battery, transducer/fan/light controller 261 automatically switches to lower power consumption states, i.e., beginning with lower fan power consumption, lower light power consumption and then on to lower transducer power consumption. Power status indicator light 256 emits a green indicator light above some threshold amount and red when the power available to transducer/fan/light controller 261 drops below the threshold level. Alternatively, transducer/fan/light controller 261, power controller/recharger 260 and/or battery assemble may be connected to an LED dot- or bar-type charge indicator and health gauge.

Operationally, portable repellent humidifier 200 should be uncomplicated. For instance, by depressing the MIST button once, transducer/fan/light controller 261 activates a single transducer, twice it activates two transducers, three depressions all of the transducers are activated, depending on the state of power availability from the battery. A subsequent depression of the MIST button will deactivate all of the transducers. Similarly, by depressing the FAN button once, transducer/fan/light controller 261 activates the lowest fan speed, sequential depressions activate the fan in higher speeds and finally deactivates the fan, as well as the LIGHT button, in which successive banks of LED bulbs are activated based on the number of successive depressions.

The presently described portable ultrasonic humidifier for repelling insect pests invention is different from that known in the prior art in its battery-powered operation. The present invention may be powered by a 110 or 220-volt line power sources or the internal battery. In the battery mode, the ultrasonic humidifier can be located in areas where line current is not available, such as patios, pavilions, pool areas, back yards, along fence lines, etc., in addition to other places where pests are attracted to people and pets with line power, such as restaurants, pavilions, common areas in condos and apartments entrance, and generally anywhere that pests come in contact with humans or animals. Since the product operates without the need of an external power source, it can be used in virtually any location where insects may be attracted. Furthermore, the battery may be replaced as needed, usually simultaneously with refilling the repellant tank, or instead may be charged conventionally using an onboard low voltage line charger or a solar panel. The portable ultrasonic humidifier trades off capacity and size for convenience, thus not fit for every application. For instance, applications needing more repellant capacity without space for accommodating a multitude of small portable humidifiers.

Figure 14:
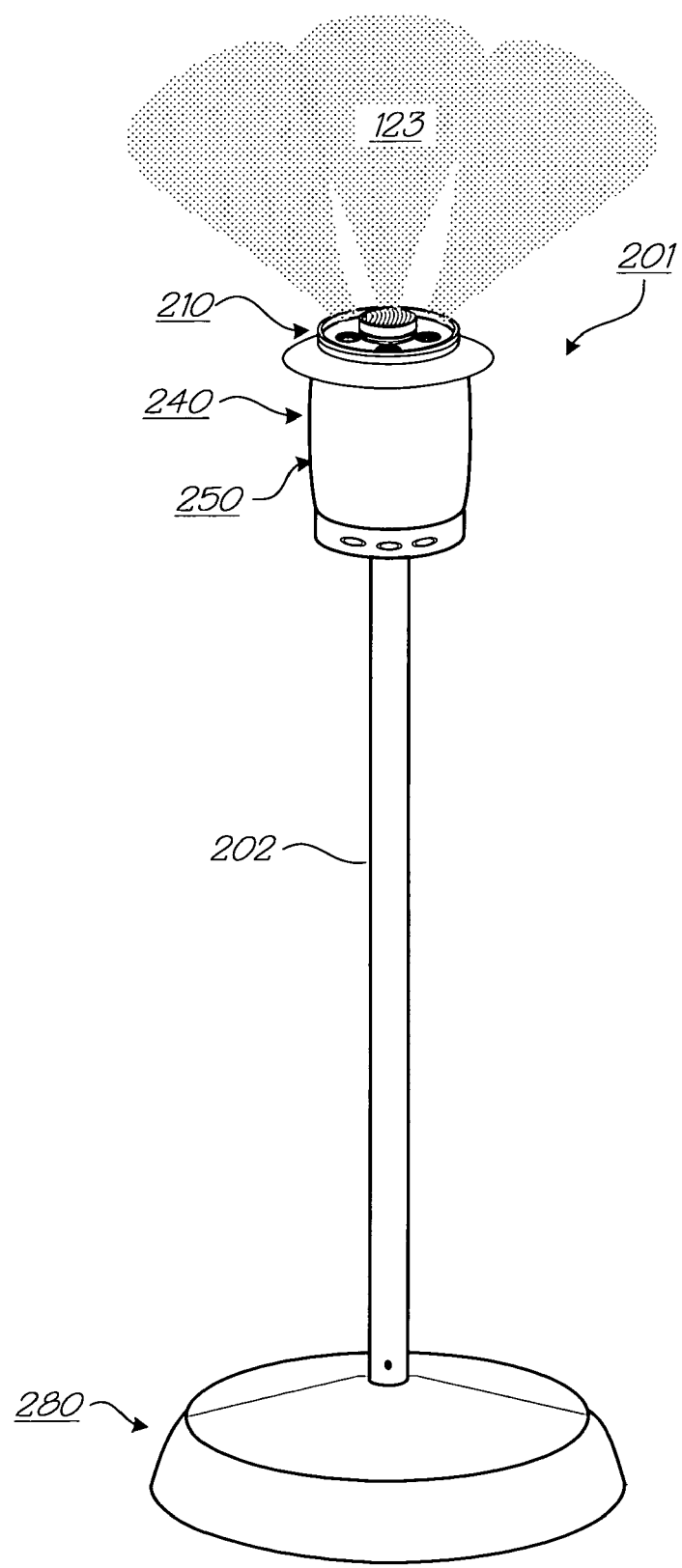
FIG. 14 depicts a portable patio repellent humidifier 201 in accordance with another exemplary embodiment of the present invention.

FIG. 14 depicts a portable patio repellent humidifier 201 in accordance with another exemplary embodiment of the present invention. Here, patio repellent humidifier 201 is similar to portable repellent humidifier 200 with the inclusion of extension 202 for elevating at least nebulizer assembly 210 above base assembly 280. It is often advantageous to elevate repellant vapor 123 for better and more homogeneous dispersion. Furthermore, because portable patio repellent humidifier 201 is floor mounted, it can achieve a scale of size. Additionally, in some facilities the amount of horizontal surfaces are limited, such as outdoor restaurants, patios, tailgating areas and pool areas. It is expected that most commercial establishments will have power outlets throughout and, therefore, base 280 may not contain a battery, but instead may connect to a power input cord.

In accordance with still another exemplary embodiment of the present invention, wick-type transducer assemblies discussed above in FIG. 11 may be disposed remotely along low-pressure repellant tubes that, rather than for providing pressurized liquid repellant for misting, merely keep the absorbent wicks covered in repellant for vaporizing by the ultrasonic transducers. FIGS. 15A, 15B and 15C depict remotely positionable transducer assembly 325 that is adaptable to conventional threaded pipe sub 326, such as a hose nibble or the like, in accordance with an exemplary embodiment of the present invention. Remotely positionable transducer assembly 325 essentially comprises transducer assembly head 324 coupled to wick assembly 220. Here, wick assembly 220 may be identical to that described above with regard to FIG. 11, but includes seal 217 to prevent repellant from contacting the ultrasonic transducer assembly without traversing absorbent wick 221. This feature channels all of the repellant into the ultrasonic transducer through the wick, which effectively modulates the repellant flow and pressure, there by preventing liquid repellant from reaching the ultrasonic transducer directly. Here, remote transducer assembly head 324 not only contains the ultrasonic transducer, but also a transducer driver circuit. Electrical power for the transducer and driver circuit is received at power receptacle 252. The aim is to provide a repositionable transducer assembly that is adaptable to a standard pipe fitting, thereby enabling a large area to be protected by repellant. It is expected that a plurality of remotely positionable transducer assemblies 325 will be configured along a permanent distribution tubing.

Figure 16A:
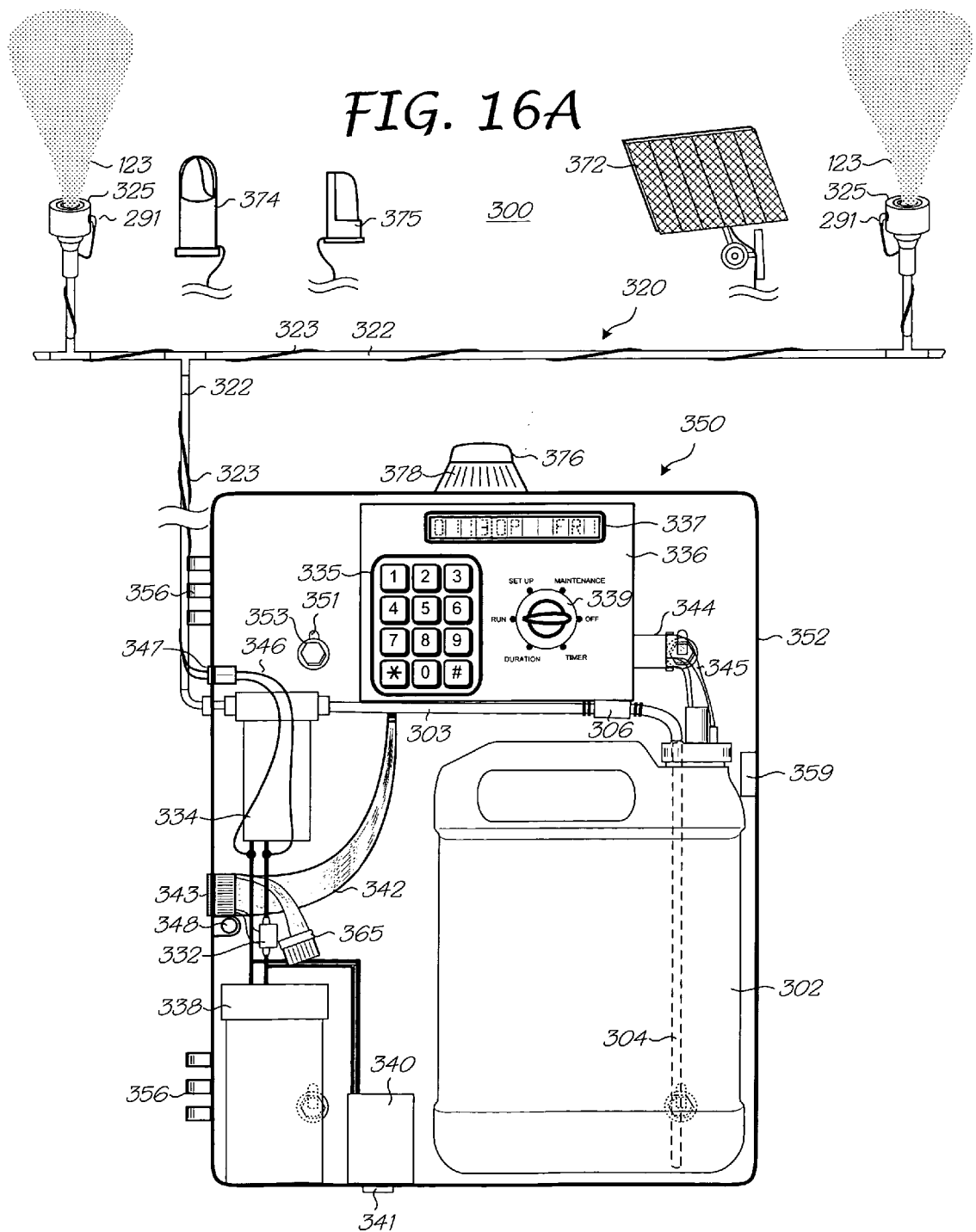
FIGS. 16A and 16B disclose the structure and operation of an exemplary embodiment of the present invention for use with remotely positionable transducer assemblies.
Figure 16B:
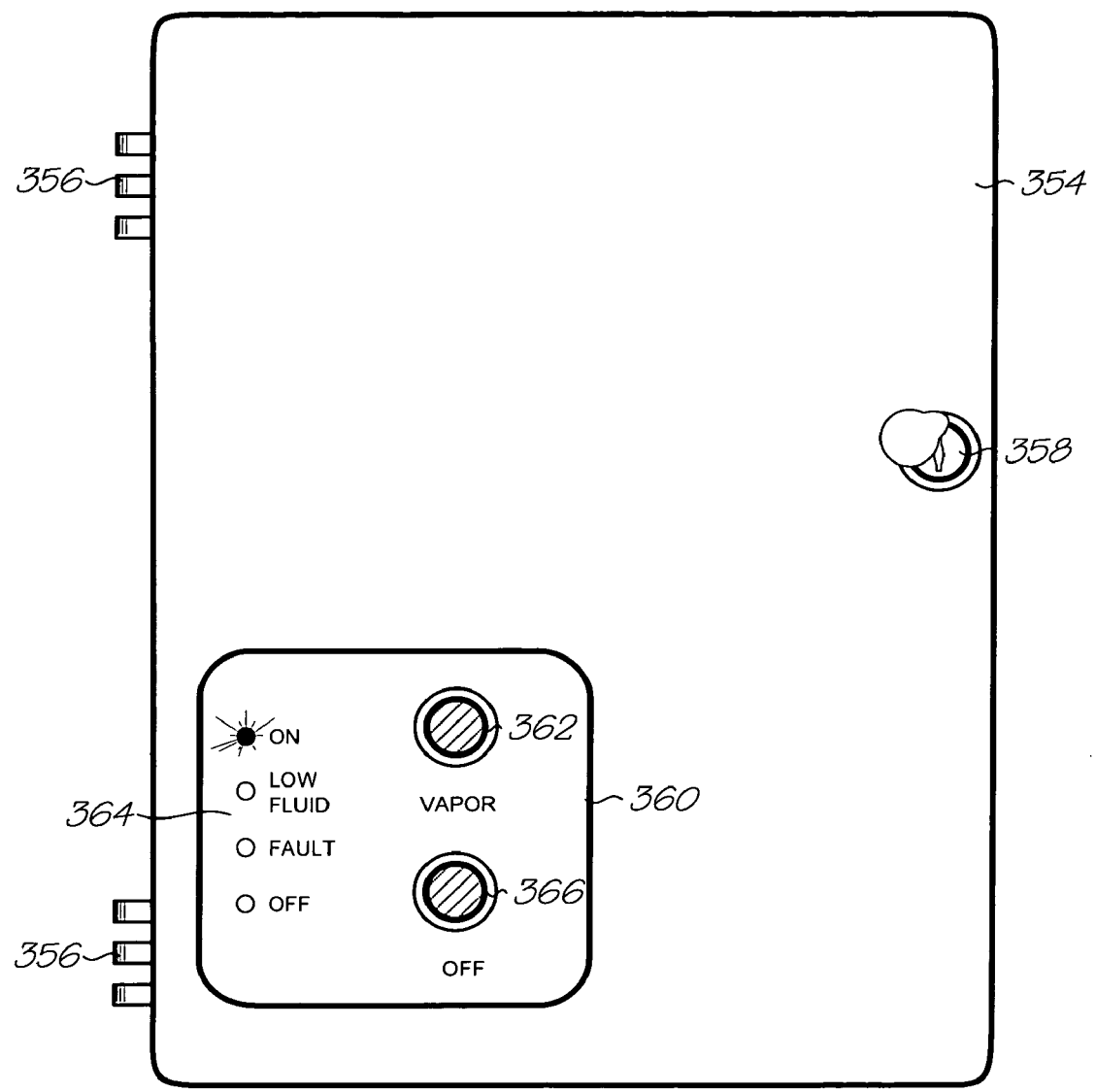

The structure and operation of an exemplary embodiment of the present invention for use with remotely positionable transducer assemblies 325 will be appreciated through a discussion of the ultrasonic humidifier system for repelling insect pests illustrated in FIGS. 16A and 16B. Automated ultrasonic humidifier system 300 generally comprises two subcomponents, controller unit 350 and dispersing elements 320. Dispersing elements 320 includes risers and tubing 322 for routing the low pressure liquid repellant to a plurality of remotely positionable transducer assemblies 325 for dispensing repellant vapor 123, as generally discussed above. The location and orientation of tubing 322 and remotely positionable transducer assemblies 325 depends on the particular application, i.e., the location, availability of mounting surfaces for tubing 322, availability of electrical power, etc. As a practical matter, the positioning and quantity of remotely positionable transducer assemblies 325 should be based on the desired repellant pattern and coverage, and the amount of repellant flow that each transducer assembly head can disperse. As discussed elsewhere above, for flying pests, a fine vapor of repellant is far more effective in deterring insects than a mist and a vapor has the added advantage of having a relatively long fallout rate where the repellant vapors remain airborne.

With further regard to automated ultrasonic humidifier system 300 illustrated in FIGS. 16A and 16B, controller unit 350 is far different from that known in the prior art for dispersing a repellant vapor, in that controller unit 350 is a self-contained reservoir system for automated vaporization of repellants at long distance from the repellant reservoir. Certain components require protection from the weather and/or should be secured from access by the general public. Thus, controller unit 350 includes a weatherproof enclosure of enclosure cabinet 352 and sealing door 354, which is pivotally attached to cabinet 352 by hinges 356. Cabinet 352 and door 354 may be any type of wall mounted storage cabinet and made of any high impact and generally nonreactive material such as PVC, or ABS plastics, fiberglass or acrylic, however if cabinet 352 and door 354 will be directly exposed to the repellant, Viton may be a better choice. Cabinet 352 may be fitted with a plurality of mounting holes 351 for securing the enclosure to a permanent structure by receiving mounting fasteners 353 and should have a volume sufficient to comfortably house a 2 or 2½ gallon container (however, any size removable container may be used that is suitable for holding repellants, or alternatively, the container can be integrated in the structure of cabinet 352), repellant tank 302, along with battery 338, low-pressure pump 334 and programmable controller 336. Additional space should be provided between low-pressure pump 334 and other heat sensitive components, as well as for performing routine maintenance such as interchanging and refilling repellant tank 302. Battery 338 may be any of a variety of DC batteries (such as a commonly available 12-volt, 18-volt, 24-volt, or other voltage that is compatible with the pump and remotely positionable transducer assemblies 325), but should be rechargeable. Also, because of the proximity to repellant vapors and sparkling at the pump motor brushes, a sealed dry cell type battery is preferable over a wet cell, although either type will suffice. Recharging unit 340 may also be provided for recharging battery 338, an external port for connecting an AC source should be provided for convenience, or alternatively, an external DC port may be provided for connecting an external recharging unit. The heart of controller unit 350 is programmable controller 336, which receives programming instructions from the operator on keypad 335 and, using onboard programming and logic, schedules vaporizations, monitors time and a variety of inputs from various sensors and, based on the information from the sensors and the vaporization schedule, initiates the ultrasonic transducer operating sequences. Programmable controller 336 may include a microprocessor, clock, controller interfaces and ROM and RAM type memories as necessary for storing, reading and writing program code, data and time/dates for executing the timing sequence and self-checks. Programmable controller 336 may instead be configured as a timer for setting a mist schedule, either manually or electronically. It is expected that if automated ultrasonic humidifier system 300 is installed at a commercial establishment, operating hours and peak patronage time periods will be known, or at least understood well enough to preprogram vaporization times and durations. Alternatively, in smaller commercial and non-commercial applications, ultrasonic humidifier system 300 may be activated manually, or via inferences from motion and/or IR sensors indicating that humans are present in the repellant coverage area.

A battery backup may be provided for programmable controller 336 for retaining programming instruction, timing and misting schedules and the like in case the primary battery 338 fails or is temporarily disconnected. Programming, maintenance and running modes may be selected using rotary switch 339 and the user inputs and other values monitored on display 337, which may be any type of single/multiline readout or display, such as LCD or LED.

Programmable controller 336 sends and receives signals from other onboard components using one or more data busses, usually secured to the backplane of cabinet 352, shown here as data bus 342 and reservoir bus 345. This bus configuration is merely exemplary and is used herein only to describe aspects of the present invention. Data bus 342 terminates at outer connector 343, which is used for electrically coupling programmable controller 336 to external sensors, switches and communication components. Data bus 342 also provides conductors for a switching current to pump control switch 332 for completing a conducting path to battery 338 that energizes pump 334 and draws repellant from repellant tank 302, via inlet tube 303. In accordance to one exemplary embodiment of the present invention, pump control switch 332 also energized transducer power bus 346, which in turn powers transducer power conductors 323 coupled between remotely positionable transducer assemblies 325 and energized transducer power bus 346, via external power conductor coupler 347. Pump control switch 332 is typically a relay or solid state device in which the high current path necessary for operating low pressure pump 334 is connected directly to the pump rather than through programmable controller 336.

Low pressure pump 334 should have a rating between 10.0 PSI and 20.0 PSI to assure that an adequate flowing pressure of between 1.0 PSI and 5.0 PSI can be maintained in remotely positionable transducer assemblies 325 during vaporization operations. The aim here is to provide a volume of repellant at each wick assembly 220, but without driving through the wick and directly into remote transducer assembly head 324 at a rate faster than can be vaporized by the ultrasonic transducers. As it is expected that the head height of remotely positionable transducer assemblies 325 above low pressure pump 334 will be between three and ten feet, low pressure pump 334 should deliver between 5.3 PSI and 9.3 PSI in order to achieve a flowing pressure of between 1.0 PSI and 5.0 PSI, assuming the density of the repellant approximates that of fresh water and no pressure loss in tubing 322. Typically, a rating of 10.0 PSI will suffice for a site having five of fewer transducer assembly heads. However, the pressure requirement for larger systems increases with the number of transducer assembly heads employed and the distance to the pump (resulting from pressure losses in the tubing). For example, a pump rating of 16.0 PSI may be needed for supporting misting in up to 20 transducer assembly heads while a pump rating of 25.0 PSI or greater may be necessary for supporting misting in 40-50 transducer assembly heads.

The present invention does more than merely dispense repellants on a predetermined schedule, but intelligently vaporizes a protected area based on several dynamic variables. These include: the state and operational status of automated ultrasonic humidifier system 300; the presence or absence of humans in the protected area; and weather conditions. These will be discussed below, however certain sensing devices may be incorporated, either internally or externally for sensing information used by programmable controller 336 in deciding whether or not to activate remotely positionable transducer assemblies 325 above low pressure pump 334 at a predetermined time. For example, weather sensor 374 senses the current weather condition and passes that information on to programmable controller 336. It is important to activate the humidifier only when pests are active and when the vaporization will be effective against the pests. Therefore, weather conditions that do not favor pest activity should be recognized to avoid wasting the repellant product. One metric of pest activity is light, for instance certain species of mosquitoes, such as the *Aedes* mosquitoes attack only during daylight hours, not at night and are far less active during overcast and foggy days. Therefore, if pests to be controlled in the protected area can be identified as being predominantly active in the day light, or conversely at night, a light sensor would provide information to programmable controller 336 that would preclude vaporizing during periods when pests are not active. The presence of a light sensor may also save repellant, for instance, if the vaporization schedule is incorrectly programmed, the days are extremely overcast, or dusk arrives early after the summer solstice that has not been reconciled in the schedule, light sensing can be used to extend or truncate the scheduled vaporization period as desired by overriding the schedule. A second metric is wind speed. Clearly, vaporization operations will be less effective in higher wind speeds, or gusts, above a predetermined threshold amount, for example a threshold of approximately 8 mph with a reset speed of approximately 3 mph (similarly, many pests are far less active in windy conditions). Upon receiving information that the wind speed is above the threshold, programmable controller 336 disables the vaporization operation until wind conditions are more favorable. Programmable controller 336 may either cancel any vaporization that is scheduled during a period where wind speed exceeds the wind threshold, or may instead delay the vaporization for a predetermined time period until the wind speed drops below the threshold. Additionally, vaporization operations will be ineffective during precipitation events, therefore a third metric is rain detection. Here again, if weather sensor 374 passes information to programmable controller 336 that rain is falling, the controller cancels vaporization. Another metric that is indicative of pest activity is the temperature. Many insects are more active at certain temperatures and inactive outside that temperature span. Thus, vaporization is ineffective. For example, many types of pests are inactive in temperatures below 55° F. (12.8° C.), and therefore, if weather sensor 374 passes information to programmable controller 336 indicating the outside temperature is not within the tolerance of the adult population, misting operations should be suspended during those periods. Another metric under investigation is barometric pressure. It has been established that certain insects can sense change in barometric pressure that may indicate the onset of severe weather. Some species of pests become extremely active at the onset of a drop in barometric pressure in foraging. If those periods of activity can be predicted by programmable controller 336, the vaporization schedule can be dynamically adjusted to repel pests during periods of heightened activity brought about by a perceived change in the weather. Thus, weather sensor 374 passes barometric pressure information to programmable controller 336, which compares the information to pressures that are known to result in increased activity of pests. If all other conditions are favorable, e.g., light, wind, rain, system status, etc, programmable controller 336 may trigger an immediate vaporization sequence.

Returning to enclosure 352, other conductors may be provided for signaling the position of door switch 348 to programmable controller 336 and for connection 365 for coupling to external control panel 360 located on the outer side of enclosure door 354. External control panel 360 provides a means for monitoring the status of programmable controller 336, as well as an interface for communicating certain user commands to programmable controller 336. For instance, visible on external control panel 360 are status indicator lights 364 representing the state of programmable controller 336, for instance status indicator lights "ON," "LOW FLUID," "FAULT," and "OFF." Using these indicator lights, anyone can quickly assess the health and status of the controller without any training whatsoever. As depicted in the figure, the ON indicator light is burning indicating that rotary switch 339 is in the RUN position, the system is active and functioning normally. If, however, either the FAULT or LOW FLUID indicator light is glowing, a service person should be contacted to ascertain the source of the fault or to refill repellant tank 302. The FAULT indicator light is activated any time that programmable controller 336 senses an internal error, such as low voltage condition, an empty repellant reservoir, memory glitch or loss, etc. If the OFF indicator light is glowing, the system has been shut down by the operator using rotary switch 339 and the system is in an inactive operational state.

External control panel 360 also provides an external switching mechanism for someone in the vicinity of the protected area to manually initiate vaporization without opening door 354, i.e., by depressing VAPOR button 366, or to terminate an ongoing vaporization cycle, by depressing OFF button 362. Another convenience feature of the present invention that will be discussed in greater detail is audible and visual alarms that alert to vaporization. Because repellant vapor 123 is virtually invisible, the operator may not appreciate when or for how long automated ultrasonic humidifier system 300 is active. Thus, unit 350 may be fitted with optional vaporization light 376 and/or optional audible alarm 378 to alert the operator that the vaporization is ongoing or pending. Optional vaporization light 376 may be any color of visible light that can be seen over the protected area, yet will not so bright as to detract from ambience of the scene. Optional, audible alert 378 should be loud but not ear splitting loud, and preferably accelerate the cadence pitch or cycle temporarily corresponding to the approach of the vaporization cycle. Typically, a single short tone followed by another alert tone after some predetermined time interval. For example, one minute prior to the vaporization, warning light 376 will flash and optional audible alert 378 will sound. As the vaporization time gets closer, the audible alarm will sound again, perhaps at an increased level, as may the intensity of warning light 376. The alerts will continue, albeit at lower, less distractive levels, until the vaporization ceases. In this way, someone working proximate to automated ultrasonic humidifier system 300 will have more than sufficient time to depress OFF button 366 to stop vaporization, even before the cycle initiates.

Additionally, programmable controller 336 may be coupled to a wireless receiver (not shown) for receiving instructions from a remote wireless transceiver. Typically, the transceiver is maintained in a secure location, such as inside the premises, but available to the employee for activating and deactivating a vaporization sequence. The transceiver will receive operational state information from automated ultrasonic humidifier system 300 which is displayed on the transceiver. Obviously, the same principle can be employed using VAPOR button 362 and OFF button 366.

Depending on the coverage area, repellant tank 302 contains a sufficient amount of repellant mixture to enable automated vaporization for between one and four days between service calls. The exact number of vaporization cycles supported by the amount of repellant in repellant tank 302 will vary depending on vaporization times, durations entered by the operator at programmable controller 336 and the size of repellant tank 302. The vaporization schedule (time and duration) is dependent on two variables: pest activity and human presence. If either is negligible, a vaporization cycle may be skipped. For example, *Aedes* mosquitoes and certain types of no see ums, midgies, sand flies, punkies and biting flies are usually more active in daylight hours, however humans may not be present in the protected until afternoon. Thus, if those types pests are primarily responsible for discomfort, vaporization sequences should be limited to afternoon hours when humans (or pets and livestock to be protected) are present and not night or mornings. The first step in scheduling vaporization sequences is always to investigate the site by inspecting the area and assessing the habits of the target pest and proximity to humans. Obviously, some amount of training may be necessary to more accurately assess the pests' habits from a single site inspection. Optimally, a 2½ gallon repellant tank is designed to humidify repellant for in excess of sixteen hours (this assumes that five or fewer transducer assembly heads are used). This will ensure that the system will not run out of product for at least a day. This fits into the daily pest control routine of most commercial establishments. Given the parameters mentioned above, the operator can program vaporization schedules for any combination of vaporization times, for instance continuously throughout the vaporization cycle, two minutes activated and then one or two minutes off, etc. Systems with more than eight transducer assembly heads should have an exterior reservoir to avoid having to fill the system too often. The more transducer assembly heads used on the system, the more product will be dispensed. Typically, there are some constraints on programming the mist schedule at programmable controller 336, for instance, vaporization times are limited to 16 discreet times a day with a maximum mist duration of two hours for each sequence. This is a function of the hardware timer or software application loaded on programmable controller 336 and may be altered. However, some constraints should be established to prevent over-misting an area.

Figure 17A:
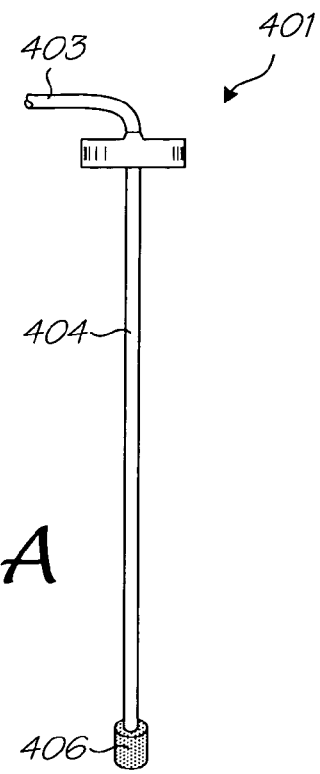
FIG. 17A illustrates a suction assembly in accordance with one exemplary embodiment of the present invention.
Figure 17B:
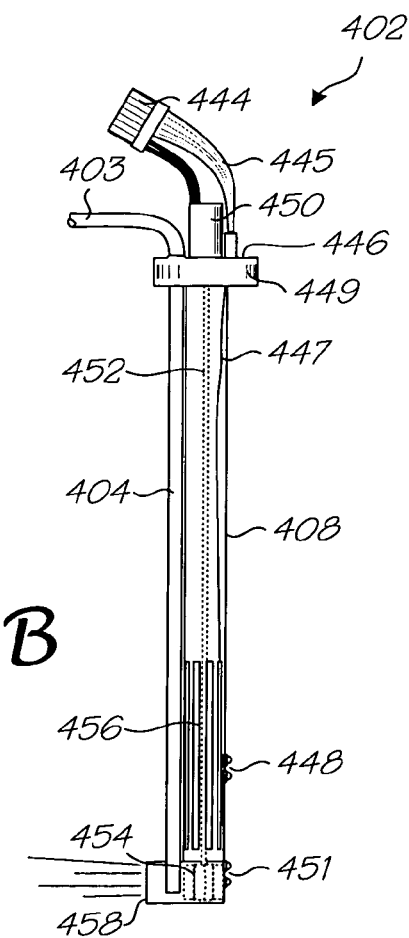
FIG. 17B illustrates a agitator suction assembly in accordance with one exemplary embodiment of the present invention.

In accordance with one exemplary embodiment of the present invention, repellant is drawn from repellant tank 402 through suction tube 404 and ported through cap 446. FIG. 17A illustrates a suction assembly in accordance with one exemplary embodiment of the present invention while FIG. 17B illustrates an agitator suction assembly in accordance with one exemplary embodiment of the present invention. In either case, a filter is installed either on suction tube 404 shown as submersible filter 406 or on inlet tube 403 depicted as external filter 406. The filter prevents congealed repellant and other foreign matter from clogging transducer assemblies 325 or damaging pump 334. However, because repellant tank 302 contains a pre-mixed dilution of repellant and water, some settling may occur between vaporizations. Therefore, and in accordance with one exemplary embodiment of the present invention, repellant tank 302 may be fitted with an agitator for stirring the repellant mixture prior to each misting (see FIGS. 17A and 17B). The agitator will include agitator motor 450, shaft 452 and agitator impeller 454 disposed within repellant tank 302 near the bottom. Agitator impeller 454 may be an exposed "pinwheel" type, or may be contained in agitator housing 408 with agitator intake slots 456 for receiving fluid and agitator outlet 458 for exhausting the fluid at some velocity for mixing. Agitator motor 450 receives power and/or run signals from programmable controller 336 over bus 345 (445 on FIG. 17B), and may be easily uncoupled for refilling repellant tank 302 using connection 344 (444 on FIG. 17B). Threaded ring 349 (449 on FIG. 17B) is also provided on cap 446 for tightening cap 446 to the spout of repellant tank 302 while enabling the operator to open repellant tank 302 without twisting the wires in reservoir bus 345.

In accordance with one exemplary embodiment of the present invention, a fluid sensor may be disposed along either suction tube 404, agitator housing 408, or on some other structure within the volume of repellant tank 302. As depicted, two sets of sensors may be employed. Low fluid sensors 448 are positioned at the low fluid level of repellant tank 302 and when uncovered by the repellant, indicate to programmable controller 336 that the repellant level should be checked and refilled. Upon sensing a low fluid condition, programmable controller 336 will activate the "LOW FLUID" external indicator light 364. Empty sensors 451 are positioned at the empty fluid level of the reservoir and when uncovered, empty sensors 451 indicate to programmable controller 336 that the fluid is empty. Upon sensing an empty fluid condition, programmable controller 336 will immediately suspend misting operations and activate the "FAULT" external indicator light 364.

Figure 18:
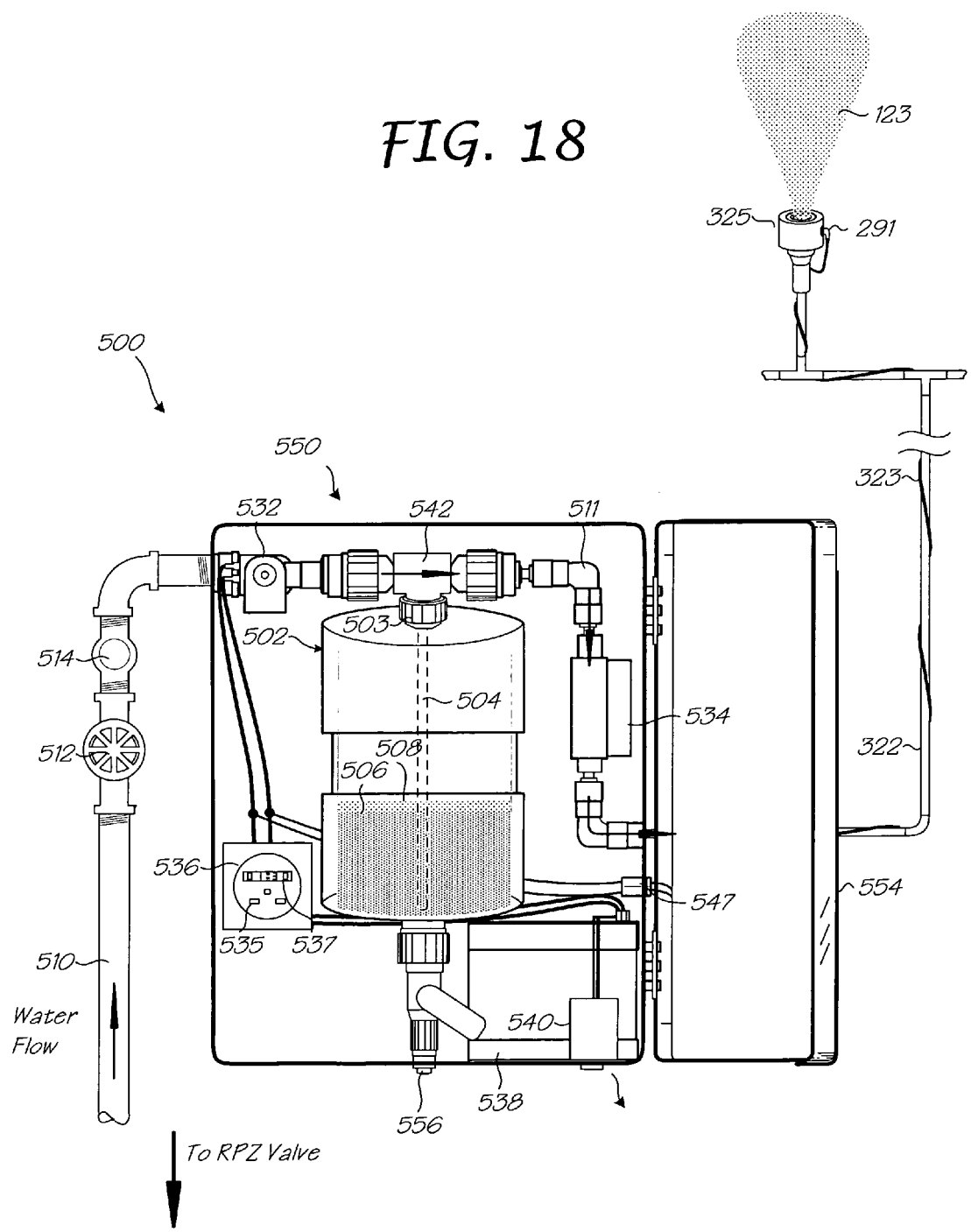
FIG. 18 is a diagram depicting an automated self-contained reservoir system for automated vaporization of repellant, for efficient control of pests in accordance with an exemplary embodiment of the present invention.

In accordance with another exemplary embodiment of the present invention, greater capacity may be achieved by using concentrated repellant in a repellant tank and by mixing the concentrate with water from pressurized water source with an injector that is connected to the dispersion elements. FIG. 18 is a diagram depicting an automated self-contained reservoir system for automated vaporization of repellant, for efficient control of pests in accordance with an exemplary embodiment of the present invention. Here, controller unit 550 generally comprises weatherproof enclosure 552 and sealing door 554 for holding internal repellant tank 502, injector 542, pressure regulator valve 534, solenoid valve 532, battery 538, and programmable controller 536.

Here, the low pressure pump may be substituted with pressure regulator valve 534 that reduces the line water pressure from between 30.0 PSI and 60.0 PSI, to a rating between 10.0

PSI and 20.0 PSI described above with regard to low pressure pump in FIG. 16A. As also mentioned above, a lower pressure rating of 10.0 PSI will suffice for a site having five of fewer ultrasonic transducers.

Pressure regulator valve 534 is connected between the low pressure side of solenoid valve 532 and the dispersing elements, e.g., tubing 522 and nozzles 525. Solenoid valve 532 may be any type of electrically operable valve or regulating device that can reliably regulate the flow of water from injector 542, such as a ball, gate or diaphragm valve which operates by means of a solenoid, actuator, motor or other electromechanical device. Optimally, solenoid valve 532 should not react with the repellant in tank 502 or the minerals in the water from source 510.

A pressurized water source 510 provides fresh water to controller unit 550 through safety valve 512 and check valve 514 (typically a reduced pressure zone (RPZ) valve is also installed further upstream which provides additional protection from potential contamination). The tubing to the back side of solenoid valve 532 is at the pressure of the water supply 510. Pressurized water floods the cavity of injector 542 and any air-filled voids in repellant tank 502 (with the repellant) and into the normally closed solenoid valve 532 tubing between injector 542 upon being activated. An equilibrium state is achieved in which repellant tank 502 and injector 542 are flooded. In the equilibrium state, the fluid is motionless. Rather than containing a diluted repellant mixture, as used in Automated Ultrasonic Humidifier System 300 discussed above, repellant tank 502 holds concentrated repellant. Typically, the concentrated repellant held within repellant tank 502 is either more or less dense than water, causing the concentrated repellant and water to separate into distinct strata when in the equilibrium state. If the concentrated repellant is denser than water, the concentrated repellant will migrate to the bottom portion of repellant tank 502, below repellant stratum level 506 (above which is stratum 508 comprised of a relatively thin stratum of diluted repellant). Therefore, the opening of suction tube 504 should be located within the repellant stratum. If the concentrated repellant is more dense than water, the opening of suction tube 504 should be positioned proximate to the bottom of the reservoir (as depicted in the figure), alternatively, if the concentrated repellant is less dense than water, the opening of the suction tube should be positioned near the top of repellant tank 502. In cases where the concentrated repellant is less dense than water, it is sometimes desirable to route suction tube 504 to the bottom and then back to the top portion of the reservoir rather than merely truncating the suction tube near the top of the reservoir. Additionally, and as will be discussed below, because the repellant that is drawn out of the reservoir is replaced by water from the injector, it is also preferable to provide a replenishment tube to the bottom of the reservoir which allows the more dense replacement water to fill from the bottom, thereby minimizing unwanted mixing with the concentrated repellant.

Optimally, programmable controller 536 receives electrical power from AC power port that is ported directly to an AC line power source, and on to battery 538. A battery backup may also be included in case battery 538 fails. Programmable controller 536 includes, or is coupled to a switching mechanism (internal or external to controller 536). The switch (not shown) is a relay or solid state device in which the high operating current for operating pressure regulator valve 534, is regulated. Solenoid valve 532 is also connected to the switch (and/or controller 536) and connected parallel in with pressure regulator valve 534. Battery 538 may be any of a variety of DC batteries, as discussed elsewhere above, in any commonly available voltage that is compatible with the electrical components, preferably a sealed dry cell type battery. Vaporization schedules are programmed into programmable controller 536 using buttons 535 and the times and other information may be verified using display 537.

Although not specifically depicted in the figure, system 500 may be configured with any or all of the external components as discussed above with respect to FIGS. 16A and 16B, including, for example, weather and motion sensors and a solar cell for recharging battery 538. Onboard recharging/rectifying unit 540 is provided and optimally includes an external AC power port 541, an AC source, or, alternatively, a DC port may be provided for connecting an external recharging unit.

Programmable controller 536 monitors time and other parameters for determining optimal conditions for misting. Once programmable controller 536 decides conditions favor for vaporization, programmable controller 536 simultaneously directs power to both solenoid valve 532 and pressure regulator valve 534 (for example, via a control signal to the switching mechanism). Normally-closed solenoid valve 532 becomes energized, causing the valve to open, and the pressurized water and repellant flows into pressure regulator valve 534 (optimally pressure regulator valve 534 is a passive valve, but alternatively may operate electrically). Pressure regulator valve 534 receives water from water supply 510 and across injector 542. Injector 542 is a venturi-like device that mixes repellant concentrate with fresh water from pipe 510. As water flows across injector 542, a low pressure is created that draws concentrated repellant from internal repellant tank 502 (by suction tube 504) and through a calibrated metering orifice of the injector and into the water in the body of the injector, but at a rate determined by the size of the metering orifice. The concentrated repellant and water mix in the body of injector 542 are drawn to pressure regulator valve 534. Once in pressure regulator valve 534, the pressure of the mixture is increased from a pressure approximately equivalent to that of the municipal water (65.0 PSI or less), to over 100.0 PSI which is optimal for transporting repellant mixture to the transducers, and exhausts the mixture through outlet tube/riser 522 to the dispersing elements.

As should be appreciated, the present invention has all of the advantages of the control unit discussed above with respect to FIGS. 16A and 16B, but with drastically increased capacity. However, servicing control unit 550 may require a technician to refill repellant tank 502 with concentrated repellant. Recall that as the concentrated repellant is drawn out of repellant tank 502 it is replaced by water. Thus, repellant tank 502 is never empty, but full of water that must be replaced by concentrated repellant. This is accomplished by switching controller 536 to OFF or MAINTENANCE and then closing valve 512. With a recovery container attached to drain valve 556, the valve is opened slowly, allowing the pressurized water to drain into the recovery container. After the pressure is released, refill cap 503 is loosened and the remaining fluid will pour into the recovery container and drain valve 556 closed. The recovery container is uncoupled from drain valve 556, sealed and disposed of properly. With repellant tank 502 empty, repellant can be refilled in repellant tank 502 through the opening beneath cap 503. Care should be taken to avoid overfilling. Once complete, cap 503 is replaced tightly, and valve 512 is opened slowly to allow the internal pressure to reach equilibrium. Finally, controller 536 is switched back to RUN and cabinet door 554 closed and locked.

The exemplary embodiments described below were selected and described in order to best explain the principles of the invention and the practical application, and to enable others of ordinary skill in the art to understand the invention for various embodiments with various modifications as are suited to the particular use contemplated. The particular embodiments described below are in no way intended to limit the scope of the present invention as it may be practiced in a variety of variations and environments without departing from the scope and intent of the invention. Thus, the present invention is not intended to be limited to the embodiment shown, but is to be accorded the widest scope consistent with the principles and features described herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. An ultrasonic repellent humidifier for dispersing a liquid insect repellent into the air as a fine repellent vapor, comprising:

a liquid repellent, wherein the liquid repellent comprises a surfactant and the liquid repellent further comprises one of geraniol, Geranium oil, cedarwood oil, citronella, citronella oil (*cymbopogon winterianus*), lemongrass oil (*cympopogon citratus*), rosemary, rosemary oil (*rosemarinus officinalis*), wintergreen oil (*gaultheria procumbens*), thyme, thyme oil (*thymus vulgaris*), cedarwood oil alcohols and cedarwood oil terpenes;

a repellent tank having an interior tank volume for holding the liquid repellent;

a repellent well having an interior well volume for holding the liquid repellent;

a metering device coupled between the repellent tank and repellent well for metering the liquid repellent from the interior tank volume of the repellent tank to the interior well volume of the repellent well;

an ultrasonic transducer for pulverizing the liquid repellent into a fine repellent vapor, said ultrasonic transducer disposed within the interior well volume of the repellent well, the ultrasonic transducer comprising:

an electro-mechanical converter;

an electronic controller for controlling the ultrasonic transducer; and an electrical power source electrically coupled to the ultrasonic transducer and to the electronic controller.

2. The ultrasonic repellent humidifier recited in claim 1, wherein the liquid repellent further comprises one of cinnamon, cinnamon oil, citric acid, clove, clove oil, eugenol, garlic and garlic oil, linseed oil, mint, mint oil, peppermint, peppermint oil and sodium lauryl sulfate.

3. The ultrasonic repellent humidifier recited in claim 1, wherein the surfactant further comprises sodium lauryl sulfate and the liquid repellent further comprises geraniol and cedar oil.

4. The ultrasonic repellent humidifier recited in claim 1, further comprises:

a seal disposed between the ultrasonic transducer and the repellent well.

5. The ultrasonic repellent humidifier recited in claim 1, further comprises:

a safety switch at least partially disposed within the interior well volume of the repellent well for sensing a level of the liquid repellent within the interior well volume of the repellent well.

6. The ultrasonic repellent humidifier recited in claim 1, wherein the electrical power source further comprises:

at least one of a DC power connection, an AC to DC power adapter, a DC car charger-adapter, an AC power connection, a transformer, a solar cell, a USB power connection, a rectifier, a battery and a battery charger.

7. The ultrasonic repellent humidifier recited in claim 1, wherein the electronic controller further comprises a countdown timer for deactivating the ultrasonic transducer in a predetermined time period after activation.

8. The ultrasonic repellent humidifier recited in claim 1, further comprises:

one of a base assembly and a handle for supporting the ultrasonic repellent humidifier.

9. The ultrasonic repellent humidifier recited in claim 8, wherein the one of a base assembly and a handle further comprises:

a handle for suspending the ultrasonic repellent humidifier above a surface.

10. The ultrasonic repellent humidifier recited in claim 8, wherein the one of a base assembly and a handle further comprises:

a base assembly for supporting the ultrasonic repellent humidifier on a surface.

11. The ultrasonic repellent humidifier recited in claim 10, wherein the base assembly further comprises:

an extension assembly mechanically coupled to the base assembly for elevating the ultrasonic repellent humidifier.

12. The ultrasonic repellent humidifier recited in claim 1, wherein the metering device further comprises:

a repellent tank valve for isolating liquid repellent in the interior tank volume of the repellent tank from the interior well volume of the repellent well.

13. The ultrasonic repellent humidifier recited in claim 1, further comprising a blower assembly, electrically coupled to the electrical power source, for generating an air stream, said blower assembly comprising:

an impeller; and a blower motor electrically coupled to the electronic controller.

14. The ultrasonic repellent humidifier recited in claim 13, wherein the blower further comprises:

one or more ducts; and one or more vents.

15. The ultrasonic repellent humidifier recited in claim 1, wherein at least a portion of the interior tank volume of the repellent tank is positioned higher than the interior well volume of the repellent well, wherein the liquid repellent flows from the interior tank volume of the repellent tank to the interior well volume of the repellent well by gravity.

16. The ultrasonic repellent humidifier recited in claim 1, wherein the ultrasonic transducer further comprises:

a vibrating surface disposed between the electro-mechanical converter and the interior well volume of the repellent well.

17. The ultrasonic repellent humidifier recited in claim 1, wherein the surfactant further comprises a wetting agent other than sodium lauryl sulfate and the liquid repellent further comprises sodium lauryl sulfate.

* * * * *